United States Patent
Ohuchi et al.

(10) Patent No.: US 6,852,564 B2
(45) Date of Patent: Feb. 8, 2005

(54) SEMICONDUCTOR DEVICE AND METHOD OF FABRICATING THE SAME

(75) Inventors: Shinji Ohuchi, Tokyo (JP); Harufumi Kobayashi, Tokyo (JP); Yasushi Shiraishi, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 10/304,767

(22) Filed: Nov. 27, 2002

(65) Prior Publication Data

US 2003/0092219 A1 May 15, 2003

Related U.S. Application Data

(62) Division of application No. 09/542,291, filed on Apr. 4, 2000, now Pat. No. 6,573,598.

(30) Foreign Application Priority Data

Apr. 6, 1999 (JP) .......................................... 11-098589
Mar. 10, 2000 (JP) ...................................... 2000-066919

(51) Int. Cl.$^7$ ............................................. H01L 21/00
(52) U.S. Cl. ............................ 438/68; 438/25; 438/26; 438/33; 438/64
(58) Field of Search ........................ 257/78, 734, 737, 257/738, 778, 780; 438/25, 26, 33, 42, 64, 67, 68

(56) References Cited

U.S. PATENT DOCUMENTS

| | | | |
|---|---|---|---|
| 5,656,863 A | 8/1997 | Yasunaga et al. | 257/778 |
| 5,672,912 A | 9/1997 | Aoki et al. | 257/693 |
| 5,757,078 A | 5/1998 | Matsuda et al. | 257/779 |
| 6,011,312 A | 1/2000 | Nakazawa et al. | 257/778 |
| 6,147,413 A | 11/2000 | Farnworth | 257/779 |
| 6,181,010 B1 | 1/2001 | Nozawa | 257/737 |
| 6,191,487 B1 | 2/2001 | Rodenbeck et al. | 257/778 |
| 6,229,209 B1 | 5/2001 | Nakamura et al. | 257/737 |
| 6,262,473 B1 | 7/2001 | Hashimoto | 257/668 |
| 6,271,588 B1 | 8/2001 | Ohuchi | 257/734 |
| 6,281,591 B1 | 8/2001 | Nakamura | 257/778 |
| 6,287,893 B1 | 9/2001 | Elenius et al. | 438/108 |
| 6,313,532 B1 | 11/2001 | Shimoishizaka et al. | 257/734 |
| 6,335,571 B1 * | 1/2002 | Capote et al. | 257/787 |

FOREIGN PATENT DOCUMENTS

| | | | |
|---|---|---|---|
| JP | 08064725 | 3/1996 | |
| JP | 10050772 | 2/1998 | |
| JP | 10098045 | 4/1998 | |
| JP | 10-359229 | 12/1998 | 257/778 |
| JP | 11-029479 | 2/1999 | 257/734 |
| JP | 11-065157 | 11/1999 | 257/778 |

OTHER PUBLICATIONS

"Super CSP: A BGA Type Real Chip Size Package Using a New Encapsulation Method"; *Proceeding of the Pan Pacific Microelectronics Symposium*; Nikkei Microdevices 1998; pp. 164–166 with partial English Translation.
"Chip Size Package"; Nikkei Microdevices 1998; pp 49–50 with partial translation.
Nikkei Electronics 1999; No. 738; p. 174 and 175.

* cited by examiner

*Primary Examiner*—David A. Zarneke
*Assistant Examiner*—Asok Kumar Sarkar
(74) *Attorney, Agent, or Firm*—Rabin & Berdo, P.C.

(57) ABSTRACT

A semiconductor device is disclosed which includes a semiconductor chip having a plurality of electrode pads on its upper surface; terminals such as copper posts formed on the upper surface of the semiconductor chip, and electrically connected to each of the electrode pads; a resin deposited on the upper surface of the semiconductor chip, encapsulating the terminals but exposing at least some of them to a predetermined height; and electroconductor members such as solder balls connected to the terminals. There is also disclosed a method of fabricating such a semiconductor device.

18 Claims, 12 Drawing Sheets

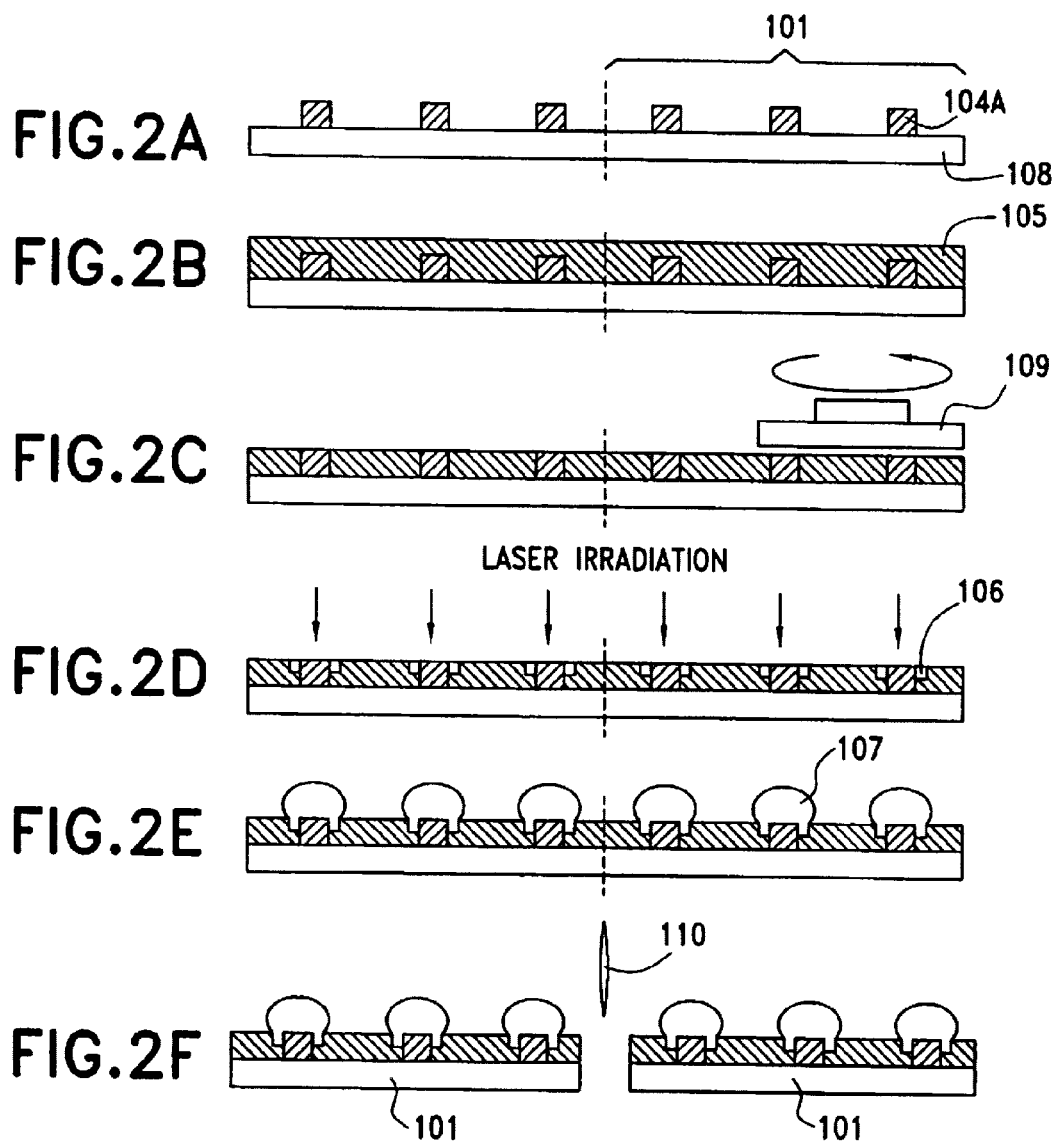

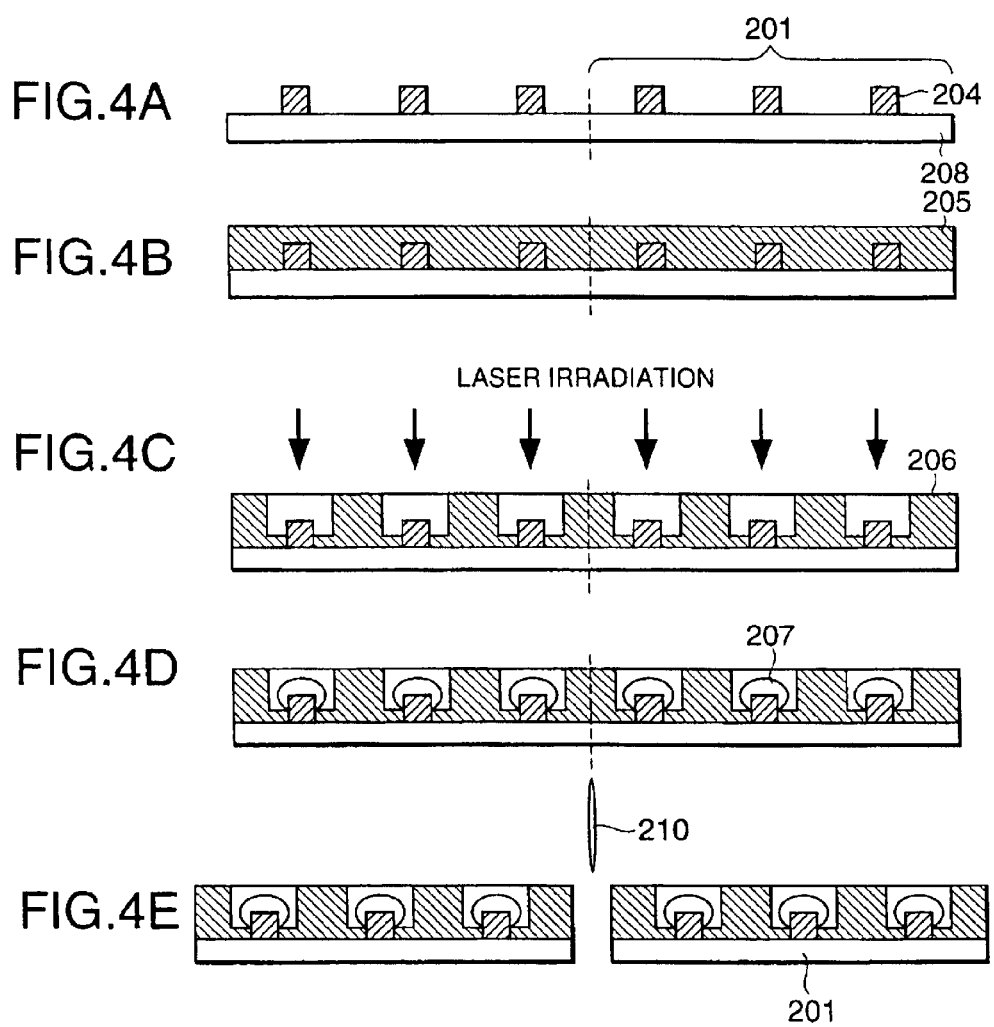

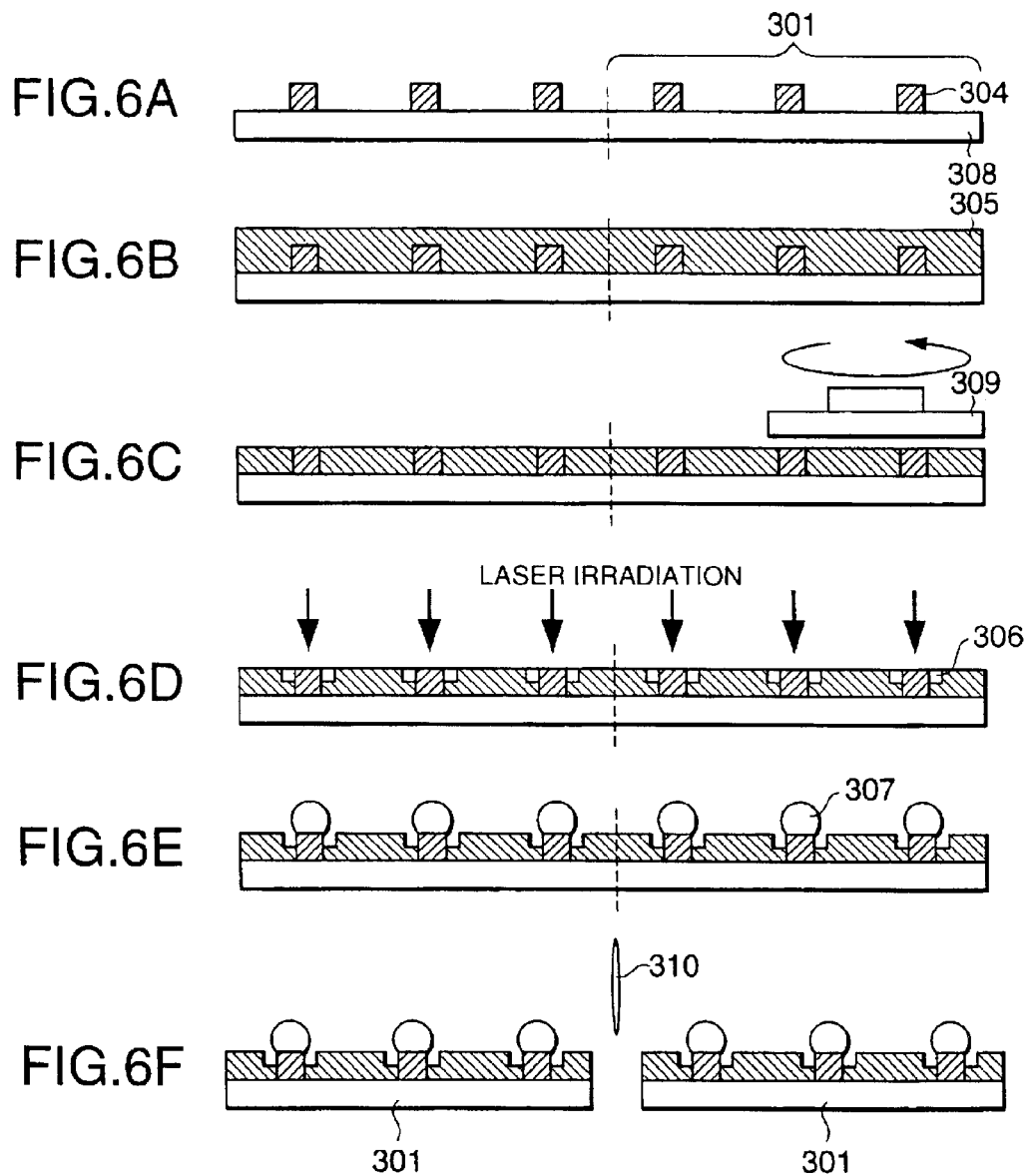

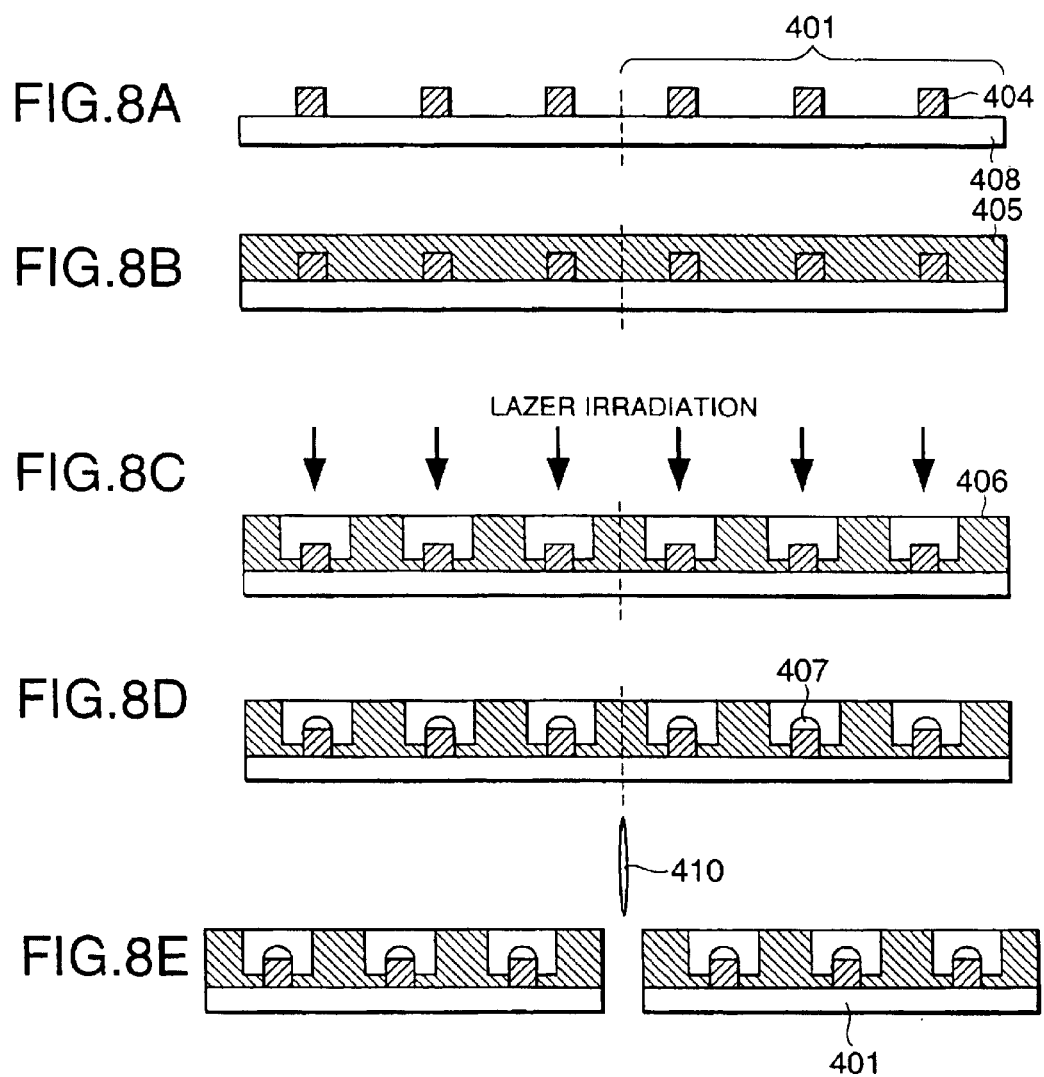

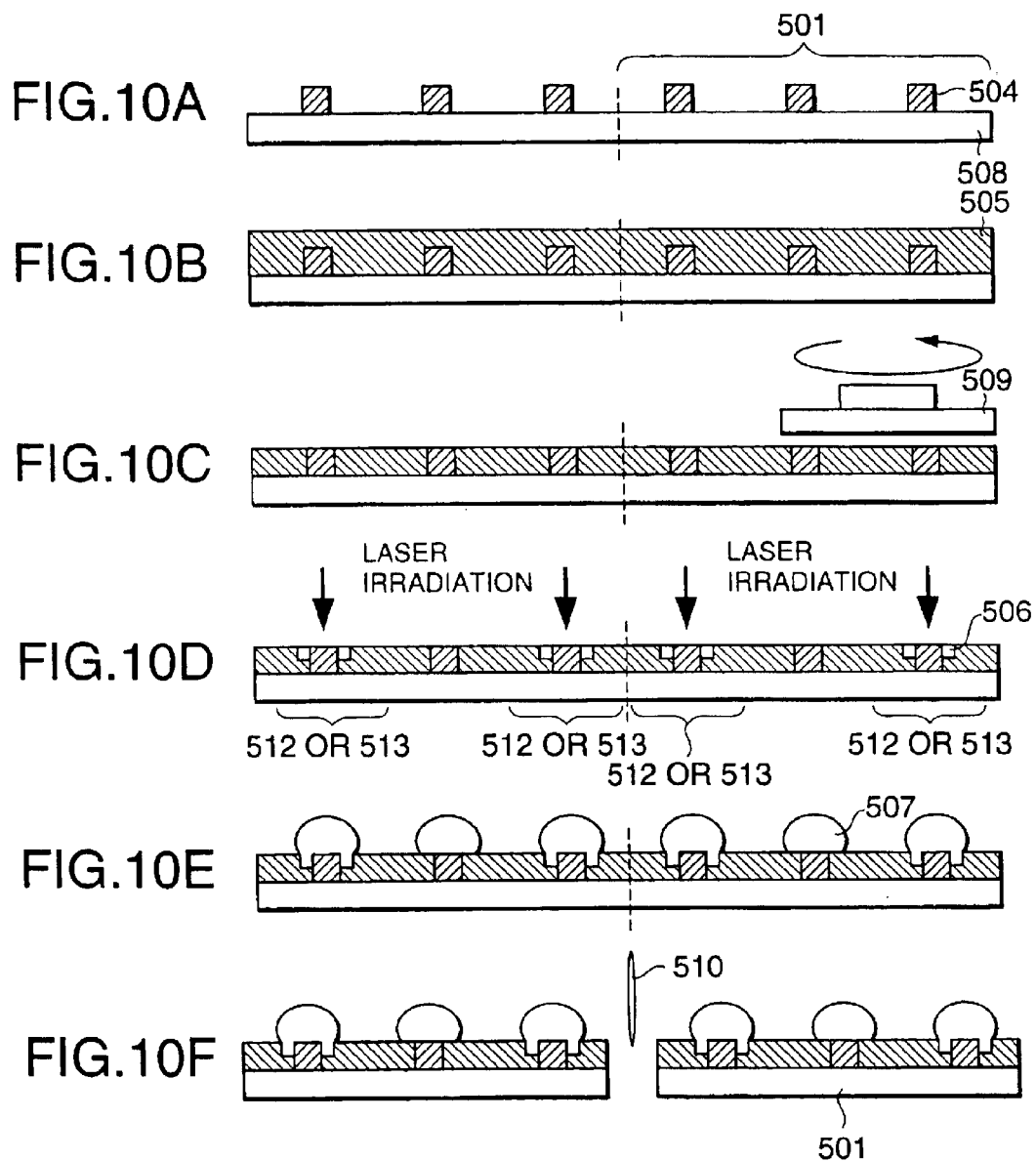

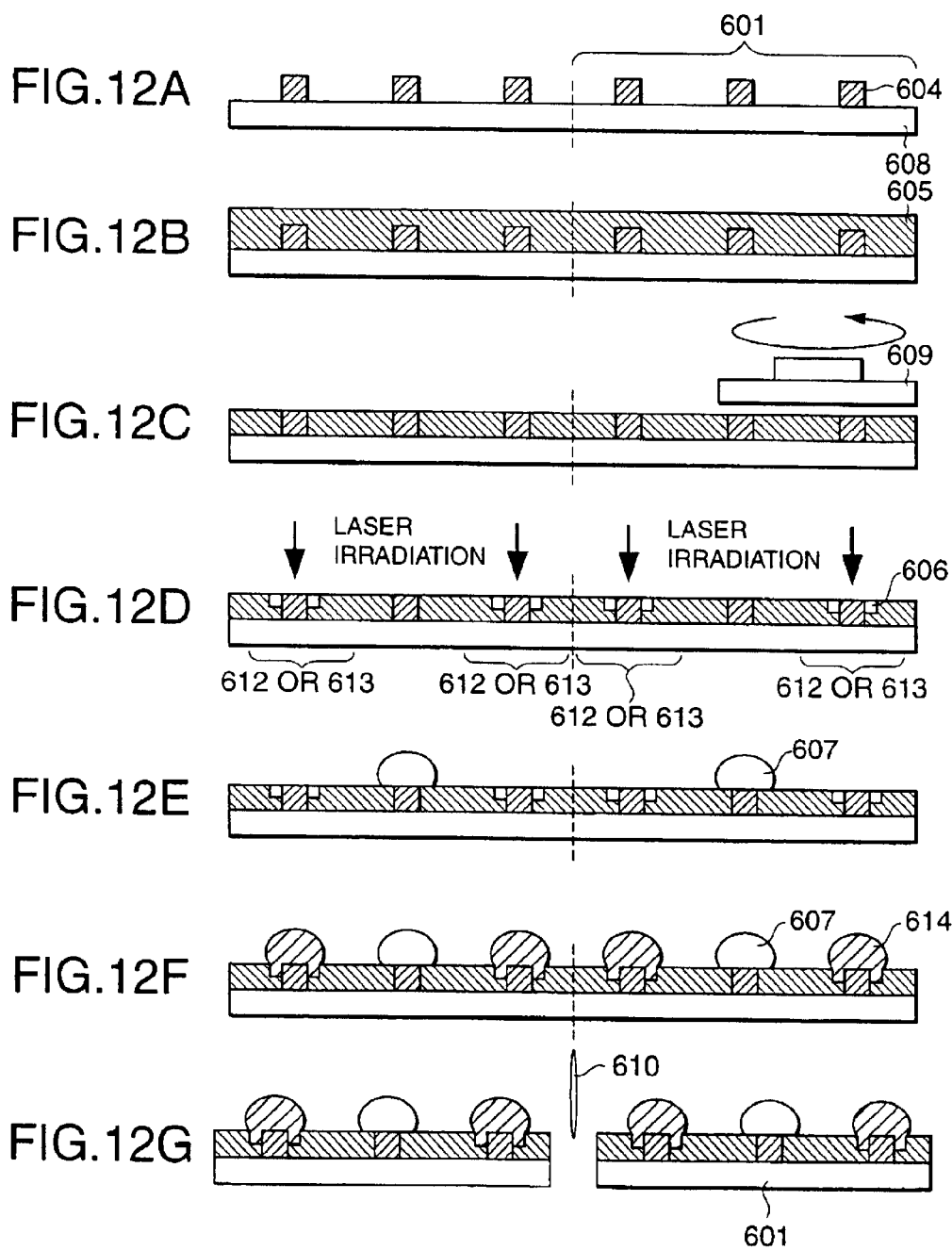

SEMICONDUCTOR DEVICE AND METHOD OF FABRICATING THE SAME

CROSS-REFERENCE TO RELATED APPLICATION

This is a division of application Ser. No. 09/542,291, now U.S. Pat. No. 6,573,598 filed Apr. 4, 2000.

BACKGROUND OF THE INVENTION

1. Field of the Invention

The present invention relates to a semiconductor device and a method of fabricating the same, and more particularly, to a semiconductor device which is resin-encapsulated in a semiconductor wafer state and a method of fabricating the semiconductor device. Thus, the invention deals with such a semiconductor device as described above having high reliability for interconnection with a substrate and a method of fabricating the semiconductor device.

2. Description of the Related Art

Portable equipment has lately come into widespread use at a rapid pace, and this has been accompanied by increasing demands for semiconductor devices mounted therein, which are thinner, smaller in size, and lighter in weight than conventional ones. A number of packaging technologies have been proposed in order to cope with such demands.

As one of such technologies, a chip size package (referred to hereinafter as CSP) equivalent or substantially equivalent in size to a semiconductor chip with an integrated circuit formed thereon has been developed.

There has been available a conventional CSP wherein rewiring conductors made of Cu, which are connected to each of the electrode pads of a semiconductor chip, are formed. Terminals called posts, which are connected to the rewiring conductors, are formed for the purpose of essentially re-locating or redisposing the electrode pads. The surface of the semiconductor chip is encapsulated with resin to the height of the terminals, and metallic electrodes such as solder balls etc. are provided at the tip of each of the terminals, exposed out of the resin.

In a method of fabricating the CSP, a polyimide layer is first formed over a semiconductor wafer. A rewiring pattern made of Cu, connected to electrode pads of a plurality of semiconductor chips formed on the semiconductor wafer, is formed. Terminals called posts, connected to respective rewiring conductors, are also formed, thereby essentially redisposing the electrode pads. Subsequently, the entire surface of the semiconductor wafer with the terminals formed thereon is resin-encapsulated, and after curing of the resin, it is abraded to the extent that the tips of the respective terminals are exposed. Furthermore, the exposed tip of each of the terminals is provided with a metallic electrode such as a solder ball etc. before dicing the semiconductor wafer into separated pieces for individual semiconductor chips.

However, when a temperature cycle test is repeatedly conducted on such a CSP as described above after it is mounted on a substrate, there arises a possibility of cracks occurring at the metallic electrodes (such as the solder balls etc.) This is attributable to a large difference in thermal expansivity between the CSP and the substrate, which results in concentration of stress at a bonding portion between the metallic electrode and the post. An alternative cause may be a small area of bonding between the respective metallic electrodes and the respective terminals of the CSP due to a narrow spacing between the terminals, which results in a reduced bonding force between the metallic electrode and the post.

SUMMARY OF THE INVENTION

It is an object of the invention to provide a semiconductor device which permits highly reliable interconnections and a method of fabricating the semiconductor device.

To this end, the invention provides a semiconductor device comprising a semiconductor chip having a plurality of electrode pads formed on the upper surface thereof, terminals formed on the upper surface of the semiconductor chip, electrically connected to each of the electrode pads, a resin deposited on the upper surface of the semiconductor chip, encapsulating the terminals such that the terminals are exposed out of the resin to the extent of a predetermined height, and electroconductors connected to the terminals.

Further, the present invention provides a method of fabricating the semiconductor device comprising a step of forming terminals on a plurality of chips that have been formed on a semiconductor wafer, said terminals being electrically connected to electrode pads of the chips, a step of depositing a resin on the upper surface of the semiconductor wafer, on the side of the terminals, so as to encapsulate the terminals, a step of exposing the side wall faces of the terminals by removing a portion of the resin on the terminals and around the same, and a step of dicing the semiconductor wafer into separated pieces for the respective chips.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 2A to 2F are views, each illustrating a method of fabricating the semiconductor device according to the first embodiment of the invention;

FIGS. 4A to 4E are views, each illustrating a method of fabricating the semiconductor device according to the second embodiment of the invention;

FIGS. 6A to 6F are views, each illustrating a method of fabricating the semiconductor device according to the third embodiment of the invention;

FIGS. 8A to 8E are views, each illustrating a method of fabricating the semiconductor device according to the fourth embodiment of the invention;

FIGS. 10A to 10F are views, each illustrating a method of fabricating the semiconductor device according to the fifth embodiment of the invention;

FIGS. 12A to 12G are views, each illustrating a method of fabricating the semiconductor device according to the sixth embodiment of the invention.

DETAILED DESCRIPTION OF THE INVENTION

Figure 1A:
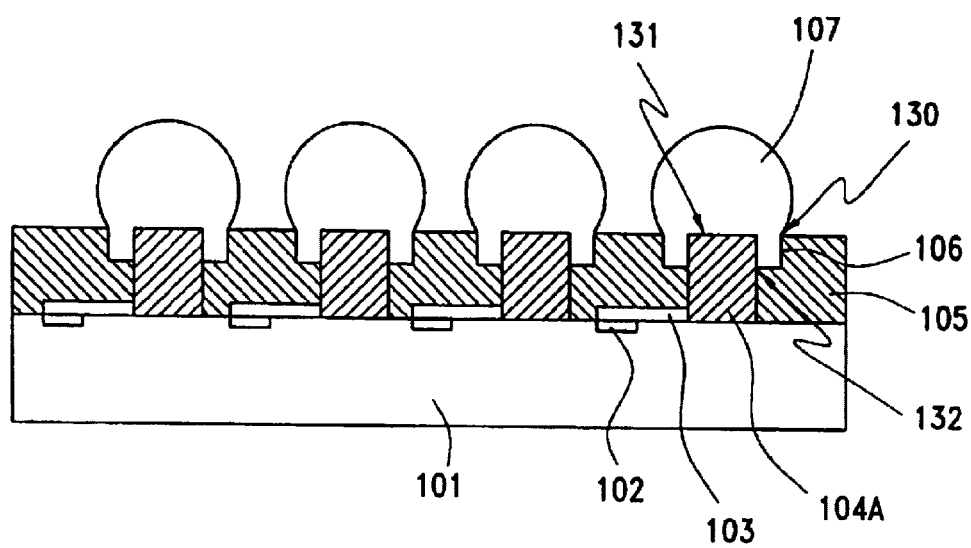
FIGS. 1A and 1B are sectional views, each showing a first embodiment of a semiconductor device according to the invention.

FIG. 1A is a sectional view showing a first embodiment of a semiconductor device according to the invention. In FIG. 1A, electrode pads 102, made of aluminum, are electrically connected to integrated circuitry of a semiconductor chip 101. The electrode pads 102 are exposed out of openings formed in a protective film (not shown) made of a nitride, etc., for protection of the integrated circuit.

Further, a polyimide layer (not shown) is formed over the semiconductor chip 101, and rewiring conductors 103 (sometimes called simply "rewiring" 103 made of copper (Cu), connected to each of the electrode pads 102, are formed over the polyimide layer. Further, a post 104A, made of Cu and serving as a terminal, is connected to each of the respective electrode pads 102 via one of the rewiring conductors 103, thereby effectively relocating the electrode pads 102. In this case, the posts 104A have a height of about 100 $\mu$m and a diameter of about 250 $\mu$m, while the spacing between the posts 104A is on the order of 500 $\mu$m.

In FIG. 1A, a resin 105 for encapsulating the rewiring conductors 103 and the posts 104A is deposited on the surface of the semiconductor chip 101 to an extent equivalent to the dimension of the semiconductor chip 101. The resin 105 has a thickness substantially equivalent to the height of the posts 104A, that is, about 100 $\mu$m. Furthermore, a groove 106 having a width in the range of about 30 to 50 $\mu$m is formed in the resin 105, around each of the posts 104A. As a result, the topmost surface and the side wall faces of the posts 104A are in states of exposure from the resin 105, so that the posts 104A are exposed to the same extent as the depth of the grooves 106. A solder ball 107 serving as a metallic electrode is bonded with the topmost surface and the side wall face of each of the posts 104A, exposed out of the resin 105.

The extent to which the posts 104A are exposed out of the resin 105 can be regulated by adjusting the depth of the grooves 106, and the depths thereof are preferably in the range of 20 to 50, taking into consideration a range wherein the solder balls 107 can be formed so as to be bonded with the side wall face of the each of posts 104A, which is exposed.

Figure 1B:
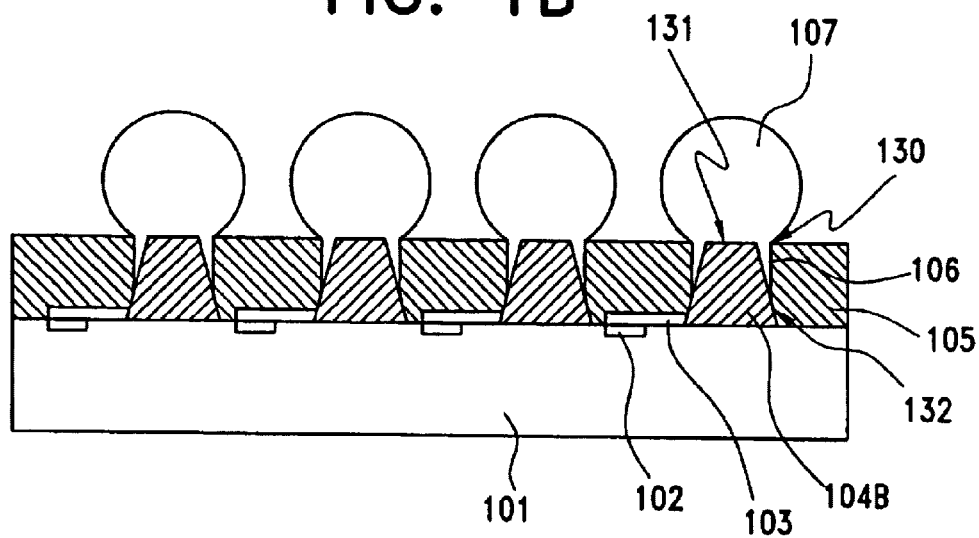

Further, in this embodiment of the invention, as shown in FIG. 1B, if the diameter of each of the posts 104B is reduced to, for example, 150 $\mu$m, flexibility of the post 104B is enhanced, so that the effect of a difference in thermal expansivity between the post 104B and a substrate on which a semiconductor device is mounted is moderated. Also, the grooves 106 can be made larger in width. Accordingly, it is expected that the solder balls 107 can then be formed with greater ease in such a way as to be bonded with the exposed portions of the side wall faces of the posts 104B.

As described in the foregoing, since the solder balls 107 are bonded with not only the topmost surface of each of the posts 104A or 104B, but also the side wall face thereof, the strength of the bond between the posts 104A or 104B and the solder balls 107 is increased. Further, in the semiconductor device of the first embodiment of the invention, stress that is conventionally concentrated in a spot where a post is bonded with a solder ball, at the time of a temperature cycle test, is dispersed in the boundary portion 130 between the surface of the resin 105 and the solder ball 107, the bonding portion 131 between the post 104 and the solder ball 107, and the boundary portion 132. Accordingly, cracks and sealing can be inhibited from occurring to the solder balls 107, thereby enhancing the reliability of interconnections.

Next, a method of fabricating the semiconductor device according to the first embodiment of the invention will be described hereinafter by referring to FIGS. 2A to 2F.

First, as shown in FIG. 2A, a polyimide layer (not shown) is first formed over a semiconductor wafer 108 from which a plurality of the semiconductor chips 101 are formed, and the rewiring conductors 103 made of Cu are formed over the polyimide layer by electroplating in such a way as to be connected to each of the electrode pads 102 of the respective semiconductor chips 101. Subsequently, the posts 104A (for example), which are connected to the electrode pads 102 via the rewiring conductors 103 are formed by electroplating. Here, the posts 104A are about 100 $\mu$m in height, and circular in a plan view, with a diameter about 250 $\mu$m. In FIGS. 2A–2F, the polyimide layer, the electrode pads 102 and the rewiring conductors 103 are omitted.

As shown in FIG. 2B, the resin 105 for encapsulating the rewiring conductors 103 and the posts 104A is deposited on the entire surface of the semiconductor wafer 108. The resin 105 has a thickness on the order of 200 $\mu$m. After curing of the resin 105, the surface of the resin 105 is abraded by use of a grinding cutter 109 so as to expose the topmost surface of the posts 104A, as shown in FIG. 2C.

As shown in FIG. 2D, laser irradiation is applied to a peripheral region of each of the posts 104A, in an area, about 30 to 50 $\mu$m larger in diameter than the diameter of the posts 104A. Resin around each of the posts 104A is removed through the laser irradiation, forming grooves 106 about 10 $\mu$m in width. As a result, the side wall face of each of the posts 104A is exposed. The copper from which the posts 104A are made reflects the laser beam, and the posts 104A are left intact. A portion of each of the posts 104A is exposed out of the resin 105 to an extent ranging from 20 to 50 $\mu$m in height. If there are 100 posts, all the grooves 106 can be formed in several seconds. The extent to which the posts 104 are exposed out of the resin 105 can be set by regulating the amount of the resin to be removed, which is achieved by varying the duration of the laser irradiation and output thereof.

Thereafter, a mask is employed to form the terminal electrodes on the semiconductor wafer using solder, and as shown in FIG. 2E, the solder balls 107 are formed in such a way as to be bonded with the topmost surface and the side wall face of each of the posts 104A, exposed out of the resin 105.

Finally, as shown in FIG. 2F, the semiconductor wafer 108 is cut into separated pieces for respective semiconductor chips 101 by use of a blade 110, for example, a diamond blade.

In the foregoing step, the solder balls 107 may be formed after the semiconductor wafer 108 is rendered into separated pieces for the semiconductor chips 101. Furthermore, any metallic electrodes having electroconductivity may be used in lieu of the solder balls 107. Further, if the resin 105 is formed over the posts 104A to a thickness on the order of several $\mu$m, there is no need of abrading the resin 105 with the use of the grinding cutter 109, and the topmost surface and the side wall face of each of the posts 104A may be exposed by removing portions of the resin 105 through laser irradiation. In this connection, the grooves 106 may be formed by irradiating a laser beam to each of the posts 104A, one by one; however, all the grooves 106 may be formed together by irradiating laser beams to all the posts 104A at one time after disposing a mask, corresponding to the posts 104A, in the vicinity of a laser light source, thereby further expediting the formation of all the grooves 106.

In carrying out this embodiment of the invention, by adoption posts 104B having a cross section substantially in a trapezoidal shape, with the width thereof narrowing upward towards the topmost surface thereof as shown in FIG. 1B, removal of portions of the resin 105, in a peripheral region of the side faced of the post 104B, can be performed with greater ease through the laser irradiation.

Next, a semiconductor device according to a second embodiment of the invention is described hereinafter by referring to FIGS. 3A to, 3D.

Figure 3A:
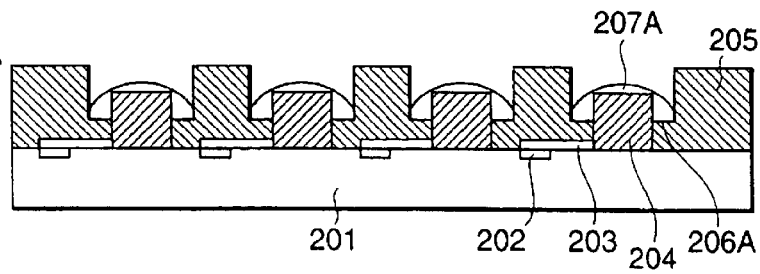
FIGS. 3A to 3D are sectional views, each showing a second embodiment of a semiconductor device according to the invention.

In FIG. 3A, similarly to the case of the first embodiment, a polyimide layer is formed over a semiconductor chip 201, and rewiring conductors 203 that are connected to each of electrode pads 202 of the semiconductor chip 201 are formed over the polyimide layer; the electrode pads 202 are connected to the posts 204 via the rewiring conductors 203, thereby effectively relocating the electrode pads 202. Here, the posts 204 have a height about 100 μm, and are circular in a plan view, with a diameter of about 250 μm. The spacing between the posts 204 is on the order of 500 μm.

In FIG. 3A, a resin 205 for encapsulating the rewiring conductors 203 and the posts 204 is deposited on the surface of the semiconductor chip 201 to an extent equivalent to the dimension of the semiconductor chip 201. The resin 205 has a thickness greater than the height of the posts 204. In this case, the resin 205 is formed to a thickness of about 200 μm. Further, a groove region 206A in the resin 205 provides a groove around each of the posts 204, having a width in the range of about 30 to 50 μm and a depth in the range of 120 to 150 μm. As a result, the topmost surface and the side wall face of each of the posts 204 are in states of exposure from the resin 205. Moreover, a solder ball 207A several μm in thickness is bonded with the topmost surface and the side wall face of each of the posts 204. Here, the exposed portion of the posts 204 falls within the range of 20 to 50 μm in height. This is set in consideration of a range within which the solder ball 207A can be formed so as to be bonded to part of the side wall face of each of the posts 204, exposed out of the resin 205.

Figure 3B:
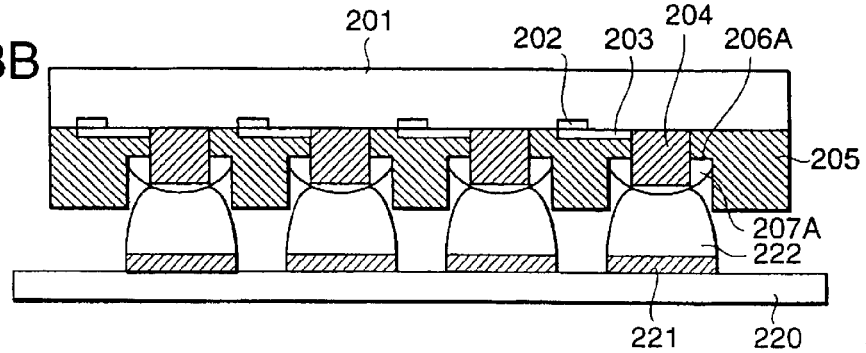

Before mounting the semiconductor device shown in FIG. 3A on a substrate, as shown in FIG. 3B, electrode pads 221 on the substrate 220 side are provided with solder deposits 222 beforehand, and the solder balls 207A of the semiconductor device are bonded with the top of the solder deposits 222, whereupon the solder provided on the substrate side enters the groove regions 206A of the semiconductor device. Solder parts can thus build up by the height of the groove regions 206A, thereby enabling a reduction in distortion of the solder parts, and enhancing the reliability of the connections with the semiconductor device.

Further, as with the case of the first embodiment of the invention, in the region where the solder is bonded with each of the posts 204, the solder is bonded with not only the topmost surface of the post 204 but also the side wall face thereof Consequently, the bond strength between the post 204 and the solder ball 207A is increased, and even if stress is developed in the region where a solder ball 207A is bonded with a post 204 at the time of a temperature cycle test, cracks and scaling can be inhibited. This enhances the reliability of the connections to the semiconductor device.

Figure 3C:
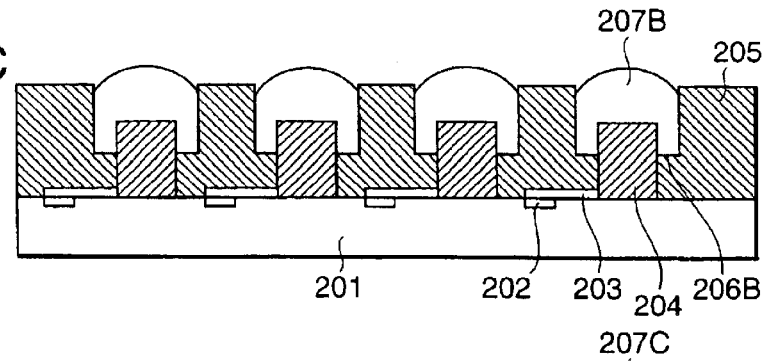
Figure 3D:
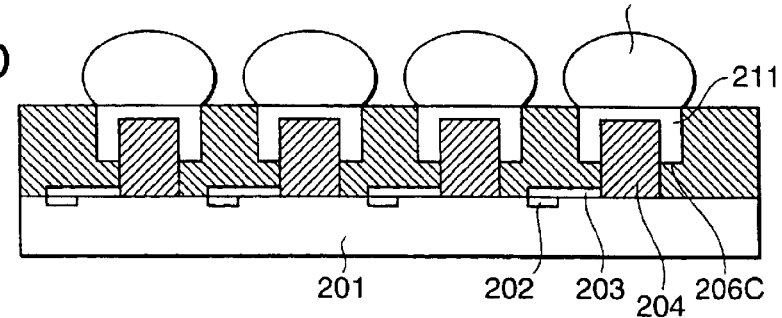

Further, in the embodiment, as shown in FIG. 3C, solder balls 207B may be formed so as to fill up the groove regions 206B. For example, the solder balls 207B can be formed by applying solder to the groove regions 206B without using any masks. Alternatively, as shown in FIG. 3D, solder 211 may be applied to a groove region 206C, and a solder ball 207C may then be formed on the solder 211. Here, the solder 211 and the solder ball 207C are formed to be united with each other, but they may be separately formed. For example, the solder 211 and the solder ball 207C can be formed by first forming the groove region 206C through laser irradiation, disposing a mask with an opening in a spot corresponding to the groove region 206C on the semiconductor chip 201, and then applying solder to the groove region 206C, the amount of the solder being equal to the thickness of the mask. Subsequently, by removing the mask, the solder ball 207C is formed by the solder, which is exposed out of the resin surface by an extent equivalent to the thickness of the mask.

Especially with the semiconductor device shown in FIG. 3D, since the height of the solder is equal to the addition of the solder 211 with the solder ball 207C and distortion of the solder is reduced, the reliability of the interconnections with the semiconductor device can be further enhanced.

With this embodiment, similarly to the case of the first embodiment, each of the posts 204 shown in FIGS. 3A to 3D may have a cross section substantially in a trapezoidal shape, with the width thereof narrowing upward towards the topmost surface thereof.

Furthermore, with this embodiment, if the diameter of each of the posts 204 is reduced to, for example, 150 μm, the flexibility of the posts 204 is enhanced, so that the effect of a difference in thermal expansion between the posts 204 and a substrate on which the semiconductor device is mounted is moderated. Also, the grooves 206A, 206B and 206C can be made larger in width. Accordingly, it is expected that the solder ball 207A, 207B or 207C can be formed with greater ease so as to be bonded with the side wall faces of the posts 204, which are exposed.

Next, a method of fabricating the semiconductor device according to the second embodiment the invention will be described by referring to FIGS. 4A to 4E.

First, as shown in FIG. 4A, a polyimide layer (not shown) is formed over the semiconductor wafer 208 from which a plurality of semiconductor chips 201 are to be made, and the rewiring conductors 203 made of Cu are formed over the polyimide layer by electroplating in such a way as to be connected to the electrode pads 202 of the semiconductor chips 201. Subsequently, the posts 204, which are connected to the electrode pads 202 via the rewiring conductors 203, are formed by electroplating. Here, the posts 204 are about 100 μm in height, and circular in a plan view, and have a diameter of about 250 μm. In FIGS. 4A–4E, the polyimide layer, the electrode pads 202 and the rewiring electrodes 203 are omitted.

Subsequently, as shown in FIG. 4B, the resin 205 for encapsulating the rewiring conductors 203 and the posts 204 is deposited on the entire surface of the semiconductor wafer 208. The resin 205 has a thickness on the order of 200 μm. After curing of the resin 205, similarly to the case of the first embodiment, as shown in FIG. 4C, laser irradiation is applied to a peripheral region around each of the posts 204, in an area about 30 to 50 μm larger in diameter than the diameter of the posts 204. Resin on and around the post 204 is then removed through the laser irradiation., forming groove regions 206 about 120 to 150 μm in depth. As a result, the topmost surfaces and the side wall faces of the posts 204 are partially exposed. At this point in time, the copper from which the respective posts 204 are made reflects the laser beam and the posts 204 are left intact. A portion of each of the posts 204 is exposed out of the resin 205, to an extent ranging from 20 to 50 μm in height. If there are 100 posts, all the groove regions 206 can be formed in several seconds. The extent to which each of the posts 204 is exposed out of the resin 205 can be set by regulating the amount of the resin to be removed, which can be achieved by varying the duration of the laser irradiation and output thereof.

Then, as shown in FIG. 4D, solder balls 207 several μm in thickness are formed in such a manner as to be bonded with the topmost surfaces and the side wall faces of the posts 204 where they are exposed out of the resin. 205. In this case, for example, the solder balls 207 can be formed by applying solder to the groove regions 206 without using any masks.

Finally, as shown in FIG. 4E, the semiconductor wafer 208 is cut into separated pieces for the respective semiconductor chips 201 by use of a blade 210, for example, a diamond blade.

In the foregoing step, the solder balls 207 may be formed after the semiconductor wafer 208 is rendered into separated pieces for the respective semiconductor chips 201. As a result, a semiconductor device having enhanced reliability for interconnection between the posts 204 and the solder balls 207 can be fabricated.

Next, a semiconductor device according to a third embodiment of the invention will be described hereinafter by referring to FIG. 5.

Figure 5:
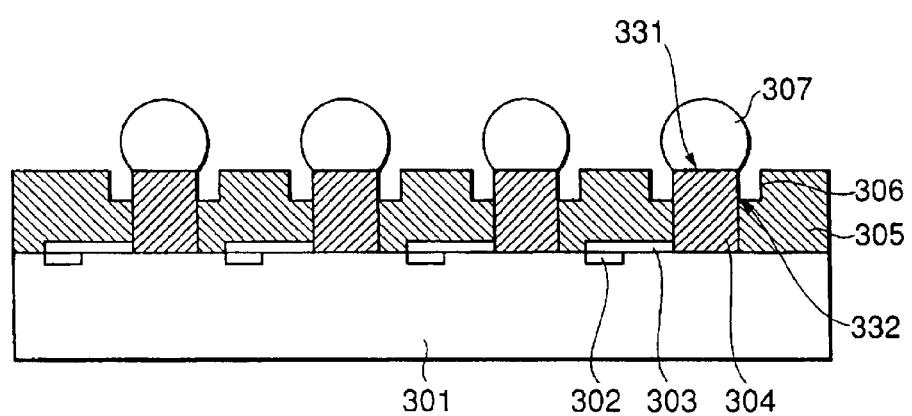
FIG. 5 is a sectional view showing a third embodiment of a semiconductor device according to the invention.

FIG. 5 is a sectional view showing a third embodiment of a semiconductor device according to the invention. In FIG. 5, electrode pads 302, made of aluminum, are electrically connected to integrated circuitry of a semiconductor chip 301. The electrode pads 302 are exposed out of openings formed in a protective film (not shown) made up of a nitride, etc., for protection of the integrated circuitry of the semiconductor chip 301. Further, a polyimide layer (not shown) is formed over the semiconductor chip 301, and rewiring conductors 303 made of Cu, each connected to one of the electrode pads 302, are formed over the polyimide layer. Further, posts 304 made of Cu, serving as terminals, are connected to the electrode pads 302 via the rewiring conductors 303, thereby essentially relocating the electrode pads 302. In this case, the posts 304 have a height of about 100 μm and a diameter of about 250 μm, with the spacing between the posts 304 being on the order of 500 μm.

In FIG. 5, a resin 305 for encapsulating the rewiring conductors 303 and the posts 304 is deposited on the surface of the semiconductor chip 301 to an extent equivalent to the dimension of the semiconductor chip 301. The resin 305 has a thickness substantially equivalent to the height of the posts 304, that is, about 100 μm. A groove 306 having a width in the range of about 30 to 50 μm is formed in the resin 305, around each of the posts 304. As a result, the topmost surface and the side wall face of each of the posts 304 are partially in states of exposure from the resin 305, so that the side wall face of the post 304 is exposed to the same extent as the depth of the groove 306. Solder balls 307 serving as metallic electrodes are bonded with the topmost surfaces of the posts 304, exposed out of the resin 305. The depth of the grooves 306 is preferably in the range of 20 to 50 μm. If the height of a post 304 is about 100 μm, support of the post 304 by the resin 305 in the portion of the post 304 lower than 20 to 50 μm from the topmost surface thereof causes a concentrated application of stress in this portion when a temperature cycle test is conducted after the semiconductor device is mounted on a substrate. As a result, stress applied to the bonding portion between the solder ball 307 and the post 304 can be reduced most efficiently. In other words, the portion of a post 304 lower by 20 to 50 μm from the topmost surface thereof can most efficiently reduce stress applied to the bonding portion between the solder ball 307 and the post 304. Even if a concentrated application of stress occurs in the foregoing portion of the post 304, since the post 304 is made of metal such as Cu, the possibility of scaling caused by cracks etc. at the post 304 is very small.

As described in the foregoing, with this embodiment, the solder balls 307 are bonded only with the topmost surface of the posts 304, and most of stress generated at the time of a temperature cycle test after the semiconductor device is mounted on the substrate is concentrated in the boundary portion 332 between the posts 304 and the resin 305. However, since the posts 304 are made of Cu, the stress applied to the bonding portion 331 between a solder ball 307 and its post 304 can be reduced more than that in the first embodiment of the invention. As a result, cracks and scaling can be inhibited from occurring to the solder ball 307, thereby enhancing the reliability of connections to the semiconductor device.

Next, a method of fabricating the semiconductor device according to the third embodiment of the invention will be described by referring to FIGS. 6A to 6F.

First, as shown in FIG. 6A, a polyimide layer (not shown) is formed over the semiconductor wafer 308, from which a plurality of semiconductor chips 301 are to be made, and rewiring conductors 303 made of Cu are formed over the polyimide layer by electroplating in such a way as to be connected to the electrode pads 302 of the semiconductor chips 301. Subsequently, posts 304 that are connected to each of the electrode pads 302 via the rewiring conductors 303 are formed by electroplating. Here, the posts 304 are about 100 μm in height, and circular in plan view, with a diameter of about 250 μm. In FIGS. 6A–6F, the polyimide layer, the electrode pads 302 and the rewiring conductors 303 are omitted.

As shown in FIG. 6B, the resin 305 for encapsulating the rewiring conductors 303 and the posts 304 is deposited on the entire surface of the semiconductor wafer 308. The resin 305 has a thickness on the order of 200 μm. After curing of the resin 305, the resin 305 is abraded by use of a grinding cutter 309 so as to expose the topmost surface of each of the posts 304 as shown in FIG. 6C.

As shown in FIG. 6D, laser irradiation is applied to a peripheral region around each of the posts 304, about 30 to 50 μm larger in diameter than the diameter of the post 304. Resin around the post 304 is removed through the laser irradiation, forming a groove 306 about 10 μm in width. As a result, the side wall face of the post 304 is exposed. The posts 304 (which are made of Cu) reflect the laser beam and are left intact. A portion of each of the posts 304 is exposed out of the resin 305, to an extent ranging from 20 to 50 μm in height. If there are 100 posts, all the grooves 306 can be formed in several seconds. The extent to which the side wall faces of the posts 304 are exposed out of the resin 305 can be set by regulating the amount of the resin to be removed, which is achieved by varying the duration of the laser irradiation and output thereof.

Thereafter, a mask is disposed for forming terminal electrodes on the semiconductor wafer, and as shown in FIG. 6E, the solder balls 307 are formed so as to be bonded with the topmost surfaces of the posts 304 exposed out of the resin 305.

Finally, as shown in FIG. 6F, the semiconductor wafer 308 is cut into separated pieces for the respective semiconductor chips 301 by use of the blade 310, made up of, for example, a diamond blade.

In the foregoing method, the solder balls 307 may be formed after the semiconductor wafer 308 is rendered into separated pieces for the respective semiconductor chips 301. Any metallic electrode having electroconductivity may be used in lieu of the solder balls 307. Further, if the resin 305 is formed over the posts 304 to a thickness on the order of several μm, there is no need of abrading the resin 305 with the use of the grinding cutter 309, and the topmost surface and the side wall face of each of the posts 304 may be exposed by removing portions of the resin 305 through laser irradiation. In this connection, the grooves 306 may be formed by irradiating a laser beam to each of the posts 304, one by one; however, all the grooves 306 may be formed together by irradiating all of the posts 304 with laser beams at one time after disposing a mask corresponding to each of the posts 304, in the vicinity of a laser source, thereby further expediting the formation of all the grooves 306.

Next, a semiconductor device according to a fourth embodiment of the invention will be described by referring to FIGS. 7A and 7B.

Figure 7A:
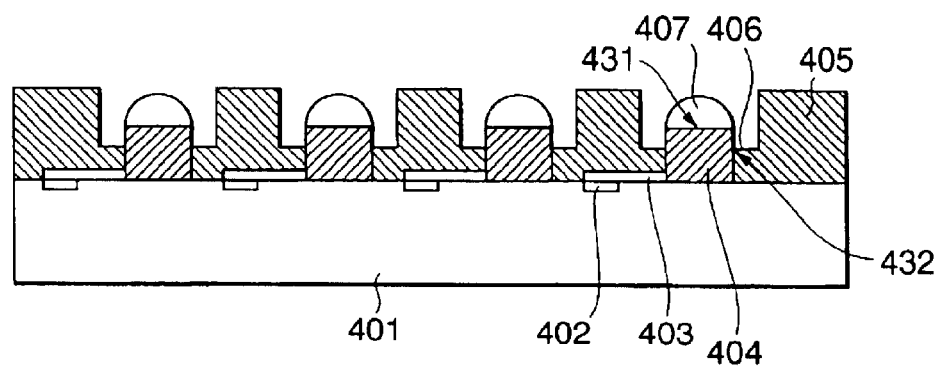
FIGS. 7A and 7B are sectional views, each showing a fourth embodiment of a semiconductor device according to the invention.

In FIG. 7A, a polyimide layer (not shown) is formed over the semiconductor chip 401, and rewiring conductors 403 connected to each of electrode pads 402 of the semiconductor chip 401 are formed over the polyimide layer. Posts 404 are connected to the electrode pads 402 via the rewiring conductors 403, thereby essentially relocating the electrode pads 402. Here, each of the posts 404 has a height of about 100 μm, and is circular in a plan view, and has a diameter of about 250 μm, with the spacing between the posts 404 being on the order of 500 μm.

In FIG. 7A, a resin 405 for encapsulating the rewiring conductors 403 and the posts 404 is deposited on the surface of the semiconductor chip 401 to an extent equivalent to the dimension of the semiconductor chip 401. The resin 405 has a thickness greater than the height of the posts 404. In this case, the resin 405 is formed to a thickness of about 200 μm. Further, groove regions 406 provide a groove in the resin 405 around each of the posts 404, having a width in the range of about 30 to 50 μm and a depth in the range of 120 to 150 μm. As a result, the topmost surface and the side wall face of each of the posts 404 are partially in states of exposure from the resin 405. Moreover, a solder ball 407 several μm in thickness is bonded with the topmost surface of each of the posts 404, exposed out of the resin 405. The exposed portion of the post 404 falls within the range of 20 to 50 μm in height. If the height of the post is about 100 μm, supporting of the post 404 by the resin 405 in the portion of the post 404 lower than 20 to 50 μm from the topmost surface thereof causes a concentrated application of stress in this portion, which is generated at the time of a temperature cycle test after the semiconductor device is mounted on a substrate. As a result, stress applied to the bonding portion between a solder ball 407 and its post 404 can be reduced more efficiently. In other words, the portion of the post 404 lower than 20 to 50 μm from the topmost surface of thereof can most efficiently reduce stress applied to the bonding portion between the solder ball 407 and the post 404. Even if a concentrated application of stress occurs in the foregoing region of the post 404, since the post 404 is made of metal such as Cu, the possibility of scaling caused by cracks etc. at the post 404 is very small.

As described in the foregoing, with this embodiment, the solder balls 407 are bonded only with the topmost surfaces of the posts 404, and most of stress generated at the time of a temperature cycle test after the semiconductor device is mounted on the substrate concentrates in the boundary portions 432 between the posts 404 and the resin 405. However, since the posts 404 are made of Cu, the stress applied to the bonding portions 431 between the solder balls 407 and the posts 404 can be reduced. As a result, cracks and scaling can be inhibited from occurring to the solder balls 407, thereby enhancing the reliability of connections to the semiconductor.

Figure 7B:
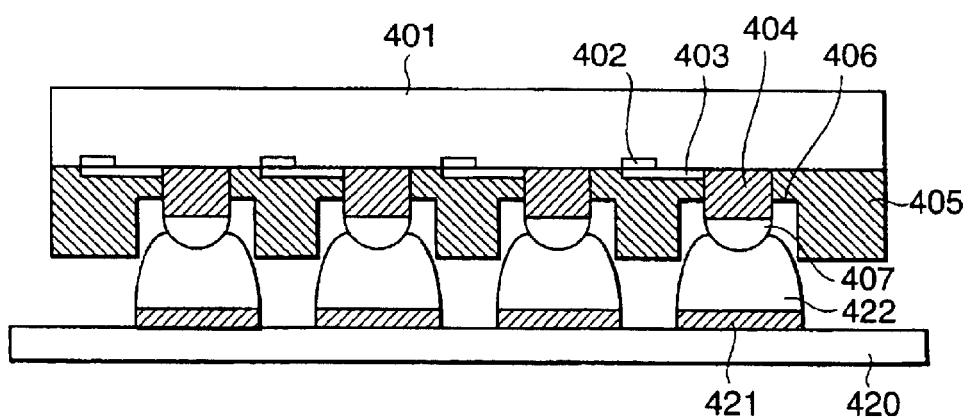

Before mounting the semiconductor device shown in FIG. 7A on the substrate, as shown in FIG. 7B, electrode pads 421 on the substrate side are provided with solder deposits 422 beforehand, and the solder balls 407 of the semiconductor device are bonded with the top of the solder deposits, whereupon the solder provided on the substrate side enters the groove region 406 of the semiconductor device. As a result, a solder part can build up by the height of the groove region 406, thereby enabling a reduction in distortion of the solder part, and enhancing the reliability of connections with the semiconductor device.

Next, a method of fabricating the semiconductor device according to the fourth embodiment of the invention will be described by referring to FIGS. 8A to 8E.

First, as shown in FIG. 8A, a polyimide layer (not shown) is formed over the semiconductor wafer 408 from which a plurality of semiconductor chips 401 are formed, and the rewiring conductors 403 (not shown) made of Cu are formed over the polyimide layer by electroplating in such a way as to be connected to electrode pads 402 (not shown) of the semiconductor chips 401. Subsequently, the posts 404, which are connected to the electrode pads 402 via the rewiring conductors, 403 are formed by electroplating. Here, the posts 404 are about 100 μm in height, and circular in plan view, and have a diameter about 250 μm.

Then, as shown in FIG. 8B, the resin 405 for encapsulating the rewiring conductors 403 and the posts 404 is deposited on the entire surface of the semiconductor wafer 408. The resin 405 has a thickness on the order of 200 μm. After curing of the resin 405, similarly to the case of the first embodiment, as shown in FIG. 8C, laser irradiation is applied to a peripheral region around each of the posts 404, about 30 to 50 μm larger in diameter than the diameter of the post 404. Resin on and around the post 404 is removed through the laser irradiation, forming a groove region 406 about 120 to 150 m in depth. As a result, the topmost surface and the side wall face of the post 404 are partially exposed out of the resin 405. The posts 404 are made of Cu and reflect a laser beam, and are thus left intact. A portion of each of the posts 404 is exposed out of the resin 405, to an extent ranging from 20 to 50 μm in height. If there are 100 posts, all the groove regions 406 can be formed in several seconds. The extent to which the posts 404 are exposed out of the resin 405 can be set by regulating the amount of the resin to be removed, which is achieved by varying the duration of the laser irradiation and output thereof.

Then, as shown in FIG. 8D, solder balls 407 with a thickness of several μm are bonded with the topmost surface of each of the posts 404 exposed out of the resin 405. In this case, the solder balls 407 can be formed, for example, by applying solder to the grooves regions 406 without using any masks.

Finally, as shown in FIG. 8E, the semiconductor wafer 408 is cut into separated pieces for the respective semiconductor chips 401 by the use of the blade 410, for example, a diamond blade.

In the foregoing method, the solder balls 407 may be formed after the semiconductor wafer 408 is cut into separated pieces for the respective semiconductor chips 401.

As a result, semiconductor devices having enhanced reliability with respect to interconnections between the posts 404 and the solder balls 407 can be fabricated.

Next, a semiconductor device according to a fifth embodiment of the invention is described hereinafter by referring to FIGS. 9A and 9B.

Figure 9A:
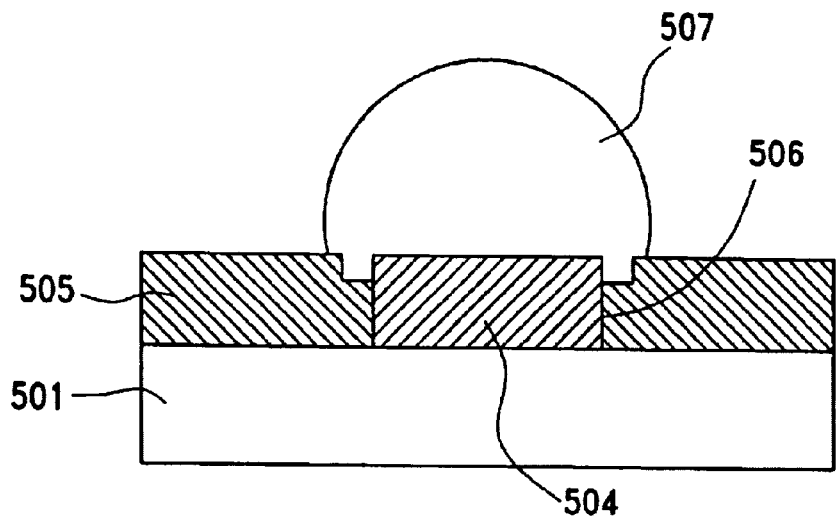
FIGS. 9A and 9B are sectional and plan views, each showing a fifth embodiment of a semiconductor device according to the invention.
Figure 9B:
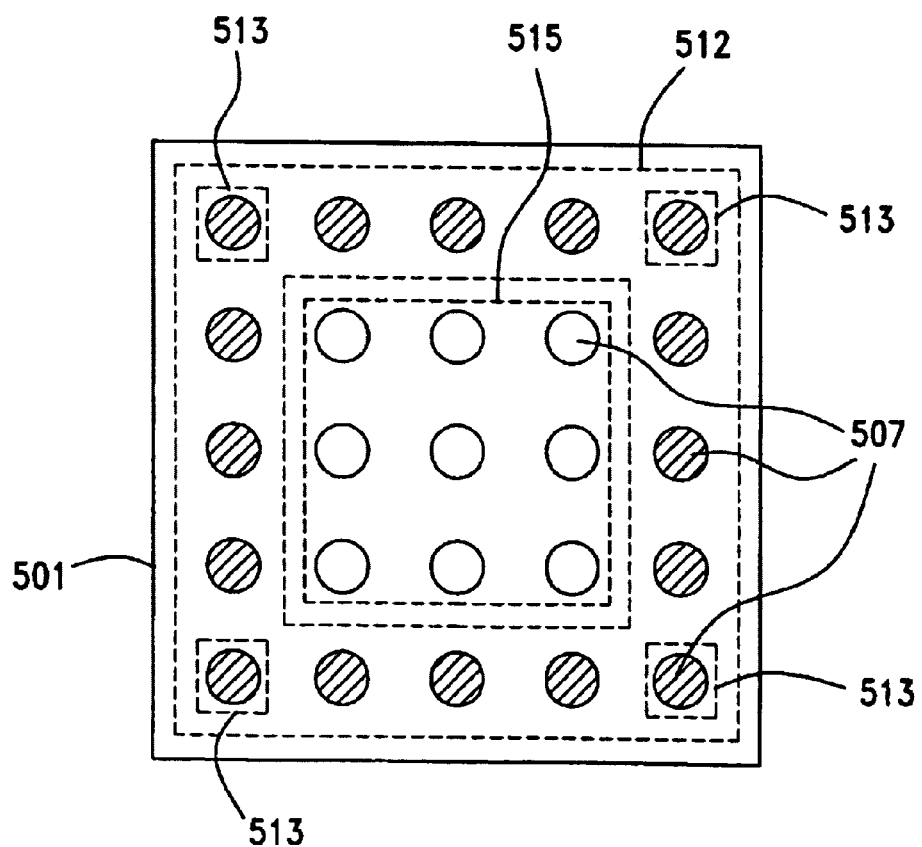

FIG. 9A is a sectional view showing a terminal electrode in the peripheral or corner region of the semiconductor device according to the fifth embodiment, and FIG. 9B is a plan view showing the entire semiconductor device of the fifth embodiment.

In this embodiment, solder balls 507 are connected to the topmost surfaces and the side wall faces of posts 504 to form terminal electrodes in a peripheral region 512 or each corner region 513 of the semiconductor device, as shown in FIG. 9A. On the other hand, terminal electrodes in the center region 515 of the semiconductor device are formed by connecting solder balls 507 to posts 504 without forming any groove regions 507 (described later).

In the sectional view of FIG. 9A, an aluminum electrode pad (not shown) is connected electrically to a semiconductor device 501 with integrated circuitry formed thereon. The electrode pad (not shown) is exposed out of an opening formed in a protective film (not shown) made up of a nitride etc. for protection of the integrated circuitry formed on the semiconductor chip 501. Further, a polyimide layer (not shown) is formed over the semiconductor chip 501, and a rewiring conductor (not shown) made of Cu is formed over the polyimide layer and is connected to the electrode pad. Further, a post 504 made of Cu, serving as a terminal, is connected to the electrode pad via the rewiring conductor, thereby effectively relocating the electrode pad. In this case, the post 504 has a height of about 100 μm and a diameter of about 250 μm, with the spacing between the post 504 shown in FIG. 9A and other posts on the semiconductor device 501 being on the order of 500 μm.

A resin 505 for encapsulating the rewiring conductors 503 and the posts 504 is deposited on the surface of the semiconductor chip 501 to an extent equivalent to the dimension of the semiconductor chip 501. The resin 505 has a thickness substantially equivalent to the height of the posts 504, that is, about 100 μm. Moreover, a groove region 506 having a width in the range of about 30 to 50 μm is formed in the resin 505, around each of the posts 504 in the peripheral region 512 (including the corner regions 513). As a result, the topmost surface and the side wall face of each of these posts 504 are partially in states of exposure from the resin 505, so that the posts 504 are exposed to the same extent as the depth of the groove regions 506. Solder balls 507 serving as metallic electrodes are bonded with the topmost surface and the side wall face of the posts 504 that are exposed out of the resin 505. In this case, the extent to which the posts 504 are exposed can be regulated by adjusting the depth of the groove regions 506, which are preferably in the range of 20 to 50 μm in depth, taking into consideration a range wherein the solder balls 407 can be formed so as to be bonded with the exposed portions of the side wall faces of the posts 504 in the peripheral region 512.

At the time of a temperature cycle test of the semiconductor device, greater thermal stress is applied in the peripheral region 512 or the corner regions 513 than in the center region 515 of the semiconductor device. Accordingly, as in the case of this embodiment, if a terminal electrode is in the peripheral region 512 or a corner region 515, greater thermal stress is applied, so connecting the solder ball 507 not only to the topmost surface but also to the side wall face of the post 504 inhibits cracks and scaling from occurring to the solder ball 507, thereby enhancing the reliability of connections to the semiconductor device. Moreover, even though the foregoing formation of the external electrode occurs only in the peripheral region 512 or the corner regions 515 of the semiconductor device, the reliability of connections to the semiconductor device can be enhanced, while a reduction in the production efficiency of the semiconductor device is suppressed Furthermore, with this embodiment, similarly to the foregoing third embodiment, in the peripheral region 512 or the corner region 515 of the semiconductor device, to which greater thermal stress is applied, a solder ball 507 serving as a metallic electrode can be formed in such a way as to be bonded with the topmost surface of the exposed post 504. As a result, as in the case of the third embodiment, the occurrence of cracks in the solder ball can be suppressed more effectively, thereby further enhancing reliability of connections to the semiconductor device.

Next, a method of fabricating the semiconductor device according to the fifth embodiment will be described by referring to FIGS. 10A to 10F.

First, as shown in FIG. 10A, a polyimide layer (not shown) is formed over the semiconductor wafer 508 from which a plurality of semiconductor chips 501 are to be formed, and rewiring conductors (not shown) made of Cu are formed over the polyimide layer by electroplating in such a way as to be connected to each of the electrode pads (not shown) of the semiconductor chips 501. Subsequently, the posts 504 which are connected to each of the electrode pads via the rewiring conductors, are formed by electroplating. Hereupon, the posts 504 is about 100 μm in height, and circular in view, and have a diameter about 250 μm.

As shown in FIG. 10B, resin 505 for encapsulating the rewiring conductors 503 and the posts 504 is deposited on the entire surface of the semiconductor wafer 508. The resin 505 has a thickness on the order of 200 μm. After curing of the resin 505, as shown in FIG. 10C, the resin 505 is abraded by use of a grinding cutter 509 so as to expose the topmost surface of each of the posts 504.

As shown in FIG. 10D, laser irradiation is applied only to the post 504 existing in the peripheral region 512 or the corner region 515 of each semiconductor chip 501, in an area about 30 to 50 larger in diameter than the diameter of the post 504. Resin around the posts 504 existing in the peripheral region 512 or the corner region 515 of the semiconductor chip 501 is removed through the laser irradiation, forming a groove region 506 about 20 to 50 μm in depth. As a result, the side wall face of the posts 504 existing in the peripheral region 512 or the corner region 515 of the semiconductor chip 501 is partially exposed. These posts 504 are made of Cu and reflect the laser beam, and so are left intact. The extent to which each of these posts 504 is exposed out of the resin 505 can be set by regulating the amount of the resin to be removed, which is achieved by varying the duration of the laser irradiation and output thereof.

Thereafter, as shown in FIG. 10F, a mask for forming the terminal electrodes is disposed on top of the semiconductor wafer, and as shown in FIG. 10E, the solder balls 507 are formed in such a way as to be bonded with the topmost surface and the side wall face of the posts 504 that are exposed out of the resin 505.

Finally, as shown in FIG. 10F, the semiconductor wafer 508 is cut into separated pieces for the respective semiconductor chips 501 by use of a blade 510, for example, a diamond blade.

In the foregoing fifth embodiment, terminal electrodes with the solder balls 507 connected to the topmost surface and the side wall face of the posts 504 may be formed in the peripheral region 512 or the comer regions 515 of the semiconductor device after the wafer 508 is separated into chips 501. Furthermore, any metallic electrodes having electroconductivity may be used in lieu of the solder balls 507.

Further, if the resin 505 is formed over the posts 504 to a thickness on the order of several μm, there is no need of abrading the resin 505 with the use of the grinding cutter 509, and the topmost surface and the side wall face of each of the posts 504 may be partially exposed by removing the resin 505 through the laser irradiation. In this connection, the groove regions 506 may be formed by irradiating each of the posts 504 with a laser beam, one by one; however, all the groove regions 506 may be formed together by irradiating laser beams to all the posts 504 at one time after disposing a mask corresponding to each o the posts 504, in the vicinity of the laser light source.

As described in the foregoing, with the fifth embodiment, the semiconductor device is fabricated by forming only the terminal electrode in the region where greater thermal stress is applied at the time of the temperature cycle test (i.e., in the peripheral region 512 or the comer regions 515 of the semiconductor device 501) in such a manner that the solder balls 507 are bonded not only with the topmost surfaces but also with the side wall faces of the posts 504. Accordingly, semiconductor devices having enhanced reliability for interconnections with the terminal electrodes can be fabricated while suppressing a reduction in production efficiency.

Next, a semiconductor device according to a sixth embodiment of the invention will be described by referring to FIGS. 11A and 11B.

Figure 11A:
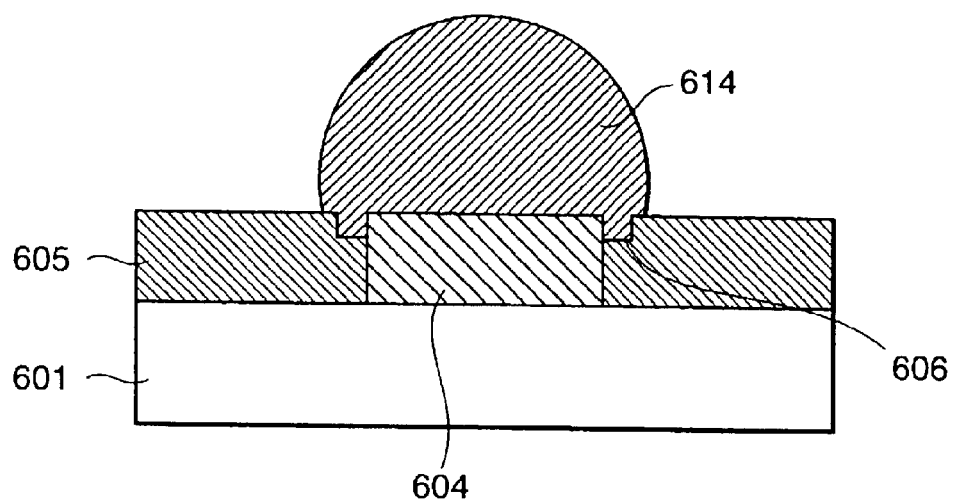
FIGS. 11A and 11B are sectional and plan views, each showing a sixth embodiment of a semiconductor device of the invention.
Figure 11B:
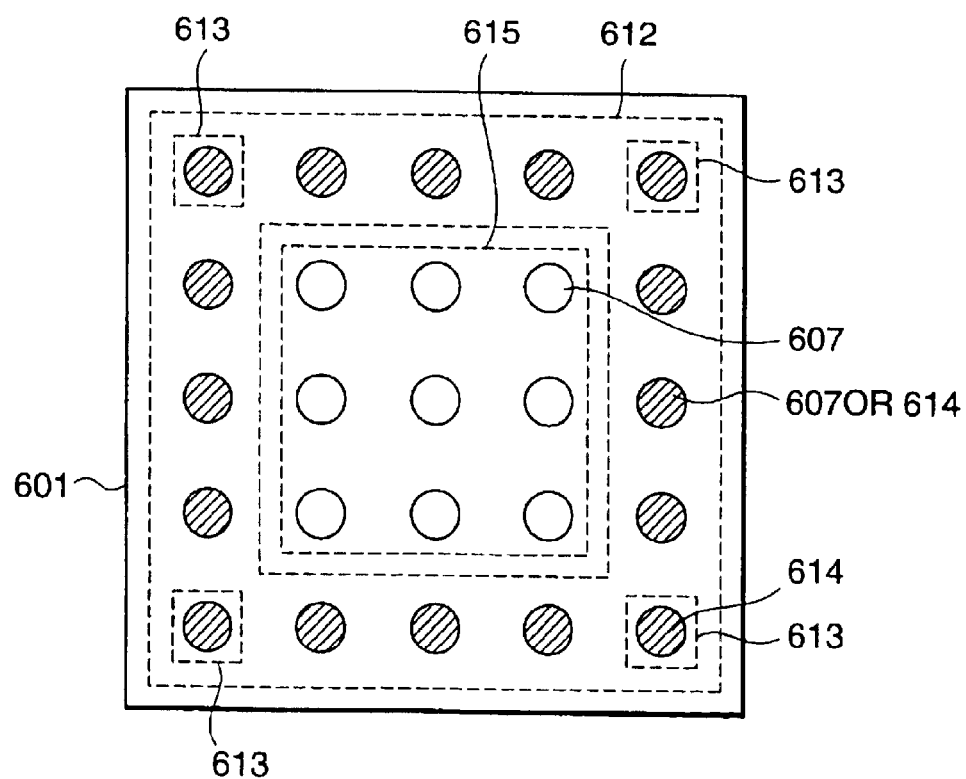

FIG. 11A is a sectional view showing the semiconductor device according to the sixth embodiment, and FIG. 11B is a plan view showing the semiconductor device according to the sixth embodiment.

In this embodiment, a bump made of a thermoplastic resin is formed on posts 604 existing in the peripheral region 612 or the comer regions 615 of the semiconductor device, and in the other region, that is, on posts 604 located in the center region 615 of the semiconductor device, terminal electrodes are formed with solder balls.

In the sectional view of FIG. 11A, aluminum electrode pads (not shown) are electrically connected to integrated circuitry of a semiconductor chip 601. The electrode pads are exposed out of openings formed in a protective film (not shown) made of a nitride etc. for protection of the integrated circuitry of the semiconductor chip 601. Further, a polyimide layer (not shown) is formed over the semiconductor chip 601, and a rewiring conductors (not shown) made of Cu are formed over the polyimide layer and connected to the electrode pads, thereby effectively relocating the electrode pads. Each of the posts 604 has a height about 100 μm and a diameter about 250 μm, with the spacing between the posts 604 being on the order of 500 μm. A resin 605 for encapsulating the rewiring conductors and the posts 604 is deposited on the semiconductor chip 601 so as to have a size equal to that of the same. The resin 605 has a thickness substantially equivalent to the height of the posts 604, that is, on the order of 100 μm. In the resin 605 around the posts 604, a groove region 606 having a with ranging from 30 to 50 μm is formed. In other words, the topmost surface and the side wall face of each of the posts 604 are partially in states of exposure from the resin 605. The side wall faces of the posts 605 are exposed to an extent equivalent to the height of the groove region 606.

In this embodiment, a bump 614 made of a thermoplastic resin is connected to the posts 604 in the peripheral region 612 or the corner regions 613 of the semiconductor device, and solder balls 607 are connected in the other region, that is, to the posts 604 in the center region 615 of the semiconductor device. Here, the extent to which the posts 604 are exposed out of the resin 605 can be set by regulating the depth of the groove region 606, and the depth of the groove regions 606 is preferably in the range of 20 to 50 μm.

When a temperature cycle test is performed for the semiconductor device, greater thermal stress is applied in the peripheral region 612 or the comer regions 613 than in the center region 615 of the semiconductor device. If the semiconductor device is mounted on a substrate, a reduction occurs in the viscosity of the thermoplastic resin due to the temperature at the mounting time and the semiconductor device adheres to the substrate. When the temperature returns to a normal level, the semiconductor device is fixed to the substrate. In such a case, if bumps made of a thermoplastic resin are formed beforehand in the peripheral region 612 or the comer regions 613 of the semiconductor device as in the case of the embodiment, then even if greater thermal stress is applied in the peripheral region 612 or the comer regions 613 of the semiconductor device, since the bumps are made of thermoplastic resin and are bonded with the posts 604, the topmost surfaces and the side wall faces thereof being partially exposed, the reliability for interconnections between the semiconductor device and the substrate can be considerably enhanced. Moreover, since bumps made of the thermoplastic resin are used only for the peripheral region 612 or the comer regions 613 of the semiconductor device, the reliability of connections with the semiconductor device for can be enhanced, while a reduction in the production efficiency is suppressed.

With this embodiment, similarly to the case of the third embodiment of the invention, in the peripheral region 612 or the comer regions 613 of the semiconductor device, to which greater thermal stress is applied, the bumps 614 made of the thermoplastic resin can be formed in such a way as to be bonded with the topmost surfaces of the posts 604. In this way, as in the case of the third embodiment, the reliability of connections to the semiconductor device can be further enhanced.

Next, a method of fabricating the semiconductor device according to the sixth embodiment of the invention will be described by referring to FIGS. 12A to 12G.

First, as shown in FIG. 12A, a polyimide layer (not shown) is formed over the semiconductor wafer 608 from which a plurality of semiconductor chips 601 are to be made, and rewiring conductors (not shown) made of Cu are formed over the polyimide layer by electroplating in such a way as to be connected to electrode pads (not shown) of the semiconductor chip 601. Subsequently, posts 604 that are connected to the electrode pads via the rewiring conductors are formed by electroplating. Here, the posts 604 are about 100 μm in height, and circular in plan view, with a diameter of about 250 μm.

As shown in FIG. 12B, the resin 605 for encapsulating the rewiring conductors and the posts 604 is deposited on the entire surface of the semiconductor wafer 608. The resin 605 has a thickness on the order of 200 μm. After curing of the resin 605, as shown in FIG. 12C, the resin 605 is abraded by use of a grinding cutter 609 so as to expose the topmost surface of each of the posts 604.

As shown in FIG. 12D, laser irradiation is applied to a peripheral region around each of the posts 604, in an area about 30 to 50 μm larger in diameter than the diameter of the post 604. Resin around the posts 604 is removed by the laser irradiation, thereby forming the groove regions 606 having a depth in the range of 20 to 50 μm. As a result, the side wall faces of the posts 604 are partially exposed. The posts 604 are made of Cu and reflect the laser beam, so they are left intact. The extent to which each of the posts 604 is exposed out of the resin 605 can be set by regulating the amount of resin to be removed, which is achieved by varying the duration of the laser irradiation and output thereof.

Thereafter, a mask for forming terminal electrodes is disposed on the posts 604 existing in the center region of the semiconductor chip 601, and as shown in FIG. 12E, solder balls 607 are formed so as to be bonded with the topmost surface and the side wall face of the posts 604 exposed out of the resin 605. After the formation of the solder balls 607, a mask for forming the bumps 614 made of a thermoplastic resin is disposed on the posts 604 existing in the peripheral region 612 or the corner regions 613 of the semiconductor chip 601, and as shown in FIG. 12F, the bumps 614 made of the thermoplastic resin are formed so as to be bonded with the topmost surfaces and the parts of the side wall faces of the posts 604 that are exposed out of the resin 605.

Finally, as shown in FIG. 12G, the semiconductor wafer 608 is cut into separated pieces for respective semiconductor chips 601 by use of the blade 610, for example, a diamond blade.

In the foregoing sixth embodiment, the bumps 614 made of the thermoplastic resin may be formed on the topmost surfaces and side faces of the posts 604 in the peripheral region 612 or the corner regions 613 of the semiconductor device after the semiconductor wafer 608 is cut into separated pieces for the respective semiconductor chips 601. Further, if the resin 605 deposited on the posts 604 has a thickness on the order of several μm, there is no need for abrading the resin 605 by using a grinding cutter 609; instead the resin 605 can be removed through laser irradiation, thereby exposing portions of the topmost surfaces and the side wall faces of the posts 604.

As described in the foregoing, with the sixth embodiment, the bumps 614 made of the thermoplastic resin are formed only in the region where greater thermal stress occurs at the time of the temperature cycle test for the semiconductor device, that is, in the peripheral region 612 or the corner region 613 of the semiconductor device 601. Accordingly, a semiconductor device having enhanced reliability in its connections with the substrate can be fabricated while a reduction in the production efficiency can be suppressed.

While the invention has been described with reference to preferred embodiments thereof by way of example, it is our intention that the invention be not limited thereto. It will be apparent to those skilled in the art that various changes and other embodiments of the invention may be made by referring to the foregoing description. It is therefore to be intended to cover in the appended claims all such changes and embodiments as fall within the true spirit and scope of the invention. forming any groove regions 507 (described later).

In the sectional view of FIG. 9A, electrode pads 502, made of aluminum, to be connected electrically to integrated circuits, respectively, are formed over a semiconductor device 501 with the integrated circuits formed thereon. The electrode pads 502 are exposed out of openings formed in a protective film (not shown) made up of a nitride film etc. for protection of the integrated circuits formed on the semiconductor chip 501. Further, a polyimide layer (not shown) is formed over the semiconductor chip 501, and a rewiring 503 made of Cu, to be connected to each of the electrode pads 502, is formed over the polyimide layer. Further, a post 504 made of Cu, serving as a terminal, is connected to each of the electrode pads 502 via the rewiring 503, thereby redisposing the electrode pads 502. In this case, the post 504 has a height about 100 μm, having the diameter about 250 μm, while a spacing between the posts 504 is in the order of 500 μm. A resin 505 for encapsulating the rewirings 503 and the posts 504 is formed on the surface of the semiconductor chip 501 to the extent equivalent to the dimension of the semiconductor chip 501. The resin 505 has a thickness substantially equivalent to the height of each of the posts 504, that is, about 100 μm. Moreover, a groove region 506 having a width in the range of about 30 to 50 μm is formed in the resin 505, around each of the posts 504. As a result, the topmost surface and the side wall face of each of the posts 504 are partially in states of exposure from the resin 505, so that the posts 504 is exposed to the same extent as the depth of the groove region 506. A solder ball 507 serving as a metallic electrode is formed so as to be bonded partially with the topmost surface and the side wall face of each of the posts 504, exposed out of the resin 505. In this case, the extent to which each of the posts 504 is exposed can be regulated by adjusting the depth of the groove region 506, and is preferably in the range of 20 to 50 μm in depth, taking into consideration a range wherein the solder ball 407 can be formed so as to be bonded with the side wall face of each of the posts 504, which is exposed.

At the time of the temperature cycle test of the semiconductor device, greater thermal stress is applied in the peripheral region 512 or the corner region 513 than in the center region 515 of the semiconductor device. Accordingly, as in the case of the embodiment, if the terminal electrode is in the peripheral region 512 or the corner region 515 of the semiconductor region, to which greater thermal stress is applied, in such a manner that the solder ball 507 is connected partially to the topmost surface and the side wall face of the post 504, cracks and exfoliation can be inhibited from occurring to the solder ball 507, thereby enhancing reliability of the semiconductor device for interconnection. Moreover, the foregoing formation of the external electrode occurs only in the peripheral region 512 or the corner region 515 of the semiconductor device, reliability of the semiconductor device for interconnection can be enhanced, while suppressing reduction in production efficiency of the semiconductor device.

Furthermore, with the embodiment, similarly to the foregoing third embodiment, in the peripheral region 512 or the corner region 515 of the semiconductor device, to which greater thermal stress is applied, the solder ball 507 serving as a metallic electrode can be formed in such a way as to be bonded with the topmost surface of the exposed post 504. As a result, as in the case of the third embodiment, the occurrence of cracks in the solder ball can be suppressed more effectively, thereby further enhancing reliability of the semiconductor device for interconnection.

Next, a method of fabricating the semiconductor device according to the fifth embodiment is described hereinafter by referring to FIGS. 10A to 10F.

First, as shown in FIG. 10A, a polyimide layer is formed over the semiconductor wafer 508 from which a plurality of semiconductor chips 501 are formed, and the rewiring 503 made of Cu is formed over the polyimide layer by electroplating in such a way as to be connected to each of the electrode pads 502 of the semiconductor chips 501. Subsequently, the post 504 to be connected to each of the electrode pads 502 via the rewiring 503 is formed by electroplating. Hereupon, the post 504 is about 100 µm in height, and circular in view, with the diameter about 250 µm. In the figure, the polyimide layer, the electrode pads 502 and the rewirings 503 are omitted.

As shown in FIG. 10B, the resin 505 for encapsulating the rewirings 503 and the posts 504 is formed on the entire surface of the semiconductor wafer 508. The resin 505 has a thickness in the order of 200 µm. After curing of the resin 505, as shown in FIG. 10C, the resin 505 is abraded by use of a grinding cutter 509 so as to expose the topmost surface of each of the posts 504.

As shown in FIG. 10D, laser irradiation is applied only to the post 504 existing in the peripheral region 512 or the corner region 515 of each semiconductor chip 501, about 30 to 50 µm larger in diameter than the diameter of the post 504. Resin around the post 504 existing in the peripheral region 512 or the corner region 515 of the semiconductor chip 501 through the laser irradiation, forming a groove region 506 about 20 to 50 µm in depth. As a result, the side wall face of the post 504 existing in the peripheral region 512 or the corner region 515 of the semiconductor chip 501 is partially exposed. At this point in time, the respective posts 504 made of Cu reflect a laser beam and left intact. An extent to which each of the posts 504 is exposed out of the resin 505 can be set by regulating a volume of the resin to be removed, which is achieved by varying a duration of the laser irradiation and output thereof.

Thereafter, as shown in FIG. 10F, a mask for forming the terminal electrode is disposed on top of the semiconductor wafer, and as shown in FIG. 10E, the solder ball 507 is formed in such a way as to be bonded partially with the topmost surface and the side wall face of the post 504 exposed out of the resin 505.

Finally, as shown in FIG. 10F, the semiconductor wafer 508 is cut into separated pieces for the respective semiconductor chips 501 by use of a blade 510, made up of, for example, a diamond blade.

In the foregoing fifth embodiment, after the semiconductor wafer 508 is cut into separated pieces for the respective semiconductor chips 501, the terminal electrode with the solder ball 507 connected partially to the topmost surface and the side wall face of the post 504 may be formed in the peripheral region 512 or the corner region 515 of the semiconductor device. Furthermore, any metallic electrode having electroconductivity may be used for the solder ball 507.

Further, if the resin 505 is formed over the posts 504 to a thickness in the order of several µm, there is no need of abrading the resin 505 with the use of the grinding cutter 509, and the topmost surface and the side wall face of each of the posts 504 may be partially exposed by removing the resin 505 through the laser irradiation. In this connection, the groove region 506 may be formed by irradiating a laser beam to each of the posts 504, one by one, however, all the groove regions 506 may be formed together by irradiating laser beams to all the posts 504 at one time after disposing a mask corresponding to each o the posts 504, in the vicinity of the laser light source.

As described in the foregoing, with the fifth embodiment, the semiconductor device is fabricated by forming only the terminal electrode in the region, to which greater thermal stress is applied at the time of the temperature cycle test of the semiconductor device, i.e., in the peripheral region 512 or the corner region 515 of the semiconductor device 501, in such a manner that the solder ball 507 is bonded partially with the topmost surface and the side wall face of the post 504. Accordingly, the semiconductor device having enhanced reliability for the interconnection of the terminal electrode can be fabricated while suppressing reduction in production efficiency.

Next, a semiconductor device according to a sixth embodiment of the invention is described hereinafter by referring to FIGS. 11A and 11B.

FIG. 11A is a sectional view showing the semiconductor device according to the sixth embodiment, and FIG. 11B is a plan view showing the semiconductor device according to the sixth embodiment.

In the embodiment, a bump made of a thermoplastic resin is formed in a post 604 existing in the peripheral region 612 or the corner region 615 of the semiconductor device, and in the other region, that is, in a post 604 located in the center region 615 of the semiconductor device, a terminal electrode is formed by a solder ball.

In the sectional view of FIG. 11A, electrode pads 602, made of aluminum, to be electrically connected to integrated circuits, respectively, are formed over a semiconductor chip 601 with the integrated circuits formed thereon. The electrode pads 602 are exposed out of openings formed in a protective film (not shown) made up of a nitride film etc. for protection of the integrated circuits formed on the semiconductor chip 601. Further, a polyimide layer (not shown) is formed over the semiconductor chip 601, and a rewiring 603 made of Cu, to be connected to each of the electrode pads 602, is formed over the polyimide layer, thereby redisposing the electrode pads 602. Each of the posts 604 has a height about 100 µm and a diameter about 250 µm, and a spacing between the posts 604 is in the order of 500 µm. A resin 605 for encapsulating the rewirings 603 and the posts 604 is formed on the semiconductor chip 601 to have a size equal to that of the same. The resin 605 has a thickness substantially equivalent to the height of the post 604, that is, in the order of 100 µm. In the resin 605 around the post 604, a groove region 606 having a with ranging from 30 to 50 µm is formed. In other words, the topmost surface and the side wall face of each of the posts 604 are partially in states of exposure from the resin 605. The side wall face of the post 605 is exposed to an extent equivalent to the height of the groove region 606.

In the embodiment, a bump 614 made of a thermoplastic resin is connected to the post 604 formed in the peripheral region 612 or the corner region 613 of the semiconductor device, and a terminal electrode is connected by a solder ball 607 to the other region, that is, the post 604 formed in the center region 615 of the semiconductor device. Hereupon, the extent to which the post 604 is exposed out of the resin 605 can be set by regulating the depth of the groove region 606, and the depth of the groove region 606 is preferably in the range of 20 to 50 µm, taking into consideration the range within which the bump 614 made of a thermoplastic resin or the terminal electrode so as to be bonded with the exposed side wall face of the post 604.

When a temperature cycle test is performed for the semiconductor device, greater thermal stress is applied in the peripheral region 612 or the corner region 613 than in the center region 615 of the semiconductor device. If the semiconductor device is mounted on a substrate, reduction occurs in the viscosity of the thermoplastic resin at the temperature of the mounting time to adhere the semiconductor device to the substrate, and when the temperature returns to a normal level, the semiconductor device is fixed to the substrate. In such a case, if a bump made of a thermoplastic resin is formed beforehand in the peripheral region 612 or the corner region 613 of the semiconductor device as in the case of the embodiment, then eve if greater thermal stress is applied in the peripheral region 612 or the corner region 613 of the semiconductor device, since the bump formed therein is made of the thermoplastic resin and the bump is bonded with the post 604, the topmost surface and the side wall face thereof being partially exposed, reliability for interconnection between the semiconductor device and the substrate can be considerably enhanced. Moreover, the foregoing formation of the bump made of the thermoplastic resin is carried out only for the peripheral region 612 or the corner region 613 of the semiconductor device. Accordingly, reliability of the semiconductor device for interconnection can be enhanced, while suppressing reduction in production efficiency thereof.

With the embodiment, similarly to the case of the third embodiment of the invention, in the peripheral region 612 or the corner region 613 of the semiconductor device, to which greater thermal stress is applied, the bump 614 made of the thermoplastic resin can be formed in such a way as to be bonded with the topmost surface of the post 604. In this way, as in the case of the third embodiment, reliability of the semiconductor device for interconnection can be further enhanced.

Next, a method of fabricating the semiconductor device according to the sixth embodiment of the invention is described hereinafter by referring to FIGS. 12A to 12G.

First, as shown in FIG. 12A, a polyimide layer is formed over the semiconductor wafer 608 from which a plurality of semiconductor chips 601 are formed, and the rewiring 603 made of Cu is formed over the polyimide layer by electroplating in such a way as to be connected to each of the electrode pads 602 of the semiconductor chip 601. Subsequently, the post 604 to be connected to each of the electrode pads 602 via the rewiring 603 is formed by electroplating. Hereupon, the post 604 is about 100 $\mu$m in height, and circular in plan view, with the diameter about 250 $\mu$m. In the figure, the polyimide layer, the electrode pads 602 and the rewirings 603 are omitted.

As shown in FIG. 12B, the resin 605 for encapsulating the rewirings 603 and the posts 604 is formed on the entire surface of the semiconductor wafer 608. The resin 605 has a thickness in the order of 200 $\mu$m. After curing of the resin 605, as shown in FIG. 12C, the resin 605 is abraded by use of a grinding cutter 609 so as to expose the topmost surface of each of the posts 604.

As shown in FIG. 12D, laser irradiation is applied to a peripheral region of each of the posts 604, about 30 to 50 $\mu$m larger in diameter than the diameter of the post 604. Resin around the post 604 is removed by the laser irradiation, thereby forming the groove region 606 having a depth in the range of 20 to 50 $\mu$m. As a result, the side wall face of the post 604 is partially exposed. At this point in time, the respective posts 604 made of Cu reflect a laser beam and are left intact. The extent to which each of the posts 604 is exposed out of the resin 605 can be set by regulating a volume of resin to be removed, which is achieved by varying a duration of the laser irradiation and output thereof.

Thereafter, a mask for forming a terminal electrode is disposed on the post 604 existing in the center region of the semiconductor chip 601, and as shown in FIG. 12E, the solder ball 607 is formed so as to be bonded partially with the topmost surface and the side wall face of the post 604 exposed out of the resin 605. After the formation of the solder ball 607, a mask for forming a bump 614 made of a thermoplastic resin is disposed on the post 604 existing in the peripheral region 612 or the corner region 613 of the semiconductor chip 601, and as shown in FIG. 12F, the bump 614 made of the thermoplastic resin is formed so as to be bonded partially with the topmost surface and the side wall face of the post 604 exposed out of the resin 605.

Finally, as shown in FIG. 12G, the semiconductor wafer 608 is cut into separated pieces for respective semiconductor chips 601 by use of the blade 610, made up of, for example, a diamond blade.

In the foregoing sixth embodiment, in portions of the topmost surface and the side face of the post 604, the bump 614 made of the thermoplastic resin may be formed in the peripheral region 612 or the corner region 613 of the semiconductor device after the semiconductor wafer 608 is cut into separated pieces for the respective semiconductor chips 601. Further, if the resin 605 formed on the post 604 has a thickness in the order of several am, there is no need of abrading the resin 605 by use of a grinding cutter 609, and the resin 605 is removed through the laser irradiation, thereby exposing portions of the topmost surface and the side wall face of the post 604.

As described in the foregoing, with the sixth embodiment, the bump 614 made of the thermoplastic resin is formed only in the region, to which greater thermal stress is applied at the time of the temperature cycle test for the semiconductor device, that is, in the peripheral region 612 or the corner region 613 of the semiconductor device 601. Accordingly, the semiconductor device having enhanced reliability of interconnection with the substrate can be fabricated while suppressing reduction in production efficiency.

While the invention has been described with reference to preferred embodiments thereof by way of example, it is our intention that the invention be not limited thereto. It will be obvious to those skilled in the art that various changes and other embodiments of the invention may be made by referring to the foregoing description. It is therefore to be intended to cover in the appended claims all such changes and embodiments as fall within the true spirit and scope of the invention.

What is claimed is:

1. A method of fabricating a semiconductor device comprising the steps of:

providing a semiconductor wafer including a plurality of semiconductor chips, each of the chips having electrode pads formed on a surface thereof and conductors connected to the electrode pads;

forming terminals on the conductors;

depositing a resin on the semiconductor wafer so as to encapsulate the terminals;

exposing upper side wall faces of the respective terminals by removing portions of the resin, around the respective terminals;

mounting electroconductors on the terminals exposed out of the resin; and dicing the semiconductor wafer along chip areas so as to form a plurality of semiconductor devices.

2. The method of fabricating a semiconductor device according to claim 1, wherein portions of the resin, over a topmost surface of and around the upper side wall faces of the respective terminals, are removed through laser irradiation.

3. The method of fabricating a semiconductor device according to claim 1, wherein each electroconductor is connected to a topmost surface of a respective one of the terminals.

4. The method of fabricating a semiconductor device according to claim 1, wherein the step of exposing is performed only for terminals formed in a peripheral portion of each of the chip areas.

5. The method of fabricating a semiconductor device according to claim 4, where in the terminals formed in the peripheral portion are formed of a thermoplastic resin.

6. the method of fabricating a semiconductor device according to claim 1, wherein each of the exposed terminals has a first width and each of the electrode conductors has a second width that is larger than the first width.

7. A method of fabricating a semiconductor device comprising the steps of:

providing a semiconductor wafer including a plurality of chip areas, the semiconductor wafer having electrode pads disposed in the chip areas and conductors connected to the electrode pads;

forming terminals on the conductors, the terminals having top surfaces and side wall faces;

depositing a resin on the semiconductor wafer, so as to encapsulate each of the terminals;

exposing the top surfaces of the terminals by polishing the resin;

exposing upper portions of the side wall faces of the terminals by removing portions of the resin, around the respective terminals;

mounting electroconductors on the terminals exposed out of the resin; and dicing the semiconductor wafer along the chip areas so as to form a plurality of semiconductor devices.

8. The method of fabricating a semiconductor device according to claim 7, wherein portions of the resin, around the respective terminals, are removed through laser irradiation.

9. The method of fabricating a semiconductor device according to claim 7, wherein the step of exposing the resin is performed only for terminals disposed in a peripheral portion of each of the chip areas.

10. The method of fabricating a semiconductor device according to claim 9, wherein the terminals formed in the peripheral portion are formed of a thermoplastic resin.

11. The method of fabricating a semiconductor device according to claim 7, wherein each of the exposed terminals has a first width and each of the electroconductors has a second width that is larger than the first width.

12. A method of manufacturing a semiconductor device comprising:

preparing a semiconductor wafer having a plurality of electrode pads formed thereon and conductors electrically connected thereto;

forming conductive posts on the conductors, the posts having top surfaces and side surfaces;

forming a resin layer to cover the posts;

removing a part of the resin layer so as to expose the top surfaces of the posts;

removing a further part of the resin layer located around the posts so that the side surfaces of the posts are exposed;

mounting electrodes on the exposed top surfaces and side surfaces of the posts; and dividing the wafer so as to obtain a plurality of semiconductor devices.

13. A method of manufacturing a semiconductor device according to claim 12, wherein the step of removing a further part is conducted by laser irradiation.

14. A method of manufacturing a semiconductor device according to claim 12, where each post has a first width at a bottom portion and a second width that is smaller than the first width at a top portion.

15. A method of manufacturing a semiconductor device according to claim 12, wherein each of the exposed posts has a first width and each of the electrodes has a second width that is larger than the first width.

16. A method of manufacturing or device according to claim 12, wherein the wafer has a plurality of device formation areas each of which has the conductors and electrode pads.

17. A method of manufacturing a semiconductor device according to claim 12, wherein the step of removing a further part is performed only for terminals formed in a peripheral portion of each of the device formation areas.

18. A method of manufacturing a semiconductor device according to claim 17, wherein the terminals formed in the peripheral portion are formed of a thermoplastic resin.

* * * * *